US008062944B2

(12) United States Patent
Higashitani

(10) Patent No.: US 8,062,944 B2
(45) Date of Patent: *Nov. 22, 2011

(54) METHOD FOR FABRICATING NON-VOLATILE STORAGE WITH INDIVIDUALLY CONTROLLABLE SHIELD PLATES BETWEEN STORAGE ELEMENTS

(75) Inventor: Masaaki Higashitani, Cupertino, CA (US)

(73) Assignee: SanDisk Techologies Inc., Plano, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/832,833

(22) Filed: Jul. 8, 2010

(65) Prior Publication Data

US 2010/0273299 A1    Oct. 28, 2010

Related U.S. Application Data

(62) Division of application No. 11/767,661, filed on Jun. 25, 2007, now Pat. No. 7,781,286.

(51) Int. Cl.
*H01L 21/336* (2006.01)

(52) U.S. Cl. . 438/257; 438/129; 438/379; 257/E21.422; 257/E21.691

(58) Field of Classification Search .................. 438/129, 438/185, 257; 257/315, 347, E21.682, E27.103
See application file for complete search history.

(56) References Cited

U.S. PATENT DOCUMENTS

| | | | |
|---|---|---|---|
| 5,877,980 A | 3/1999 | Mang | |
| 5,936,887 A | 8/1999 | Choi | |
| 5,990,514 A | 11/1999 | Choi | |
| 6,044,017 A | 3/2000 | Lee | |
| 6,093,605 A | 7/2000 | Mang | |
| 6,246,607 B1 | 6/2001 | Mang | |
| 6,434,038 B1 | 8/2002 | Ohno | |
| 6,677,199 B1 | 1/2004 | Chang | |
| 6,760,253 B2 | 7/2004 | Kamei | |
| 6,845,042 B2 | 1/2005 | Ichige | |
| 7,061,040 B2 | 6/2006 | Shih | |
| 7,075,823 B2 | 7/2006 | Harari | |
| 7,164,168 B2 | 1/2007 | Forbes et al. | |
| 7,636,260 B2 | 12/2009 | Higashitani | |
| 7,781,286 B2 | 8/2010 | Higashitani | |
| 7,808,826 B2 * | 10/2010 | Higashitani | .............. 365/185.17 |

(Continued)

OTHER PUBLICATIONS

Choi, "A triple polysilicon stacked flash memory cell with wordline self-boosting programming," 1997 IEEE, pp. 283-286.

(Continued)

*Primary Examiner* — Charles Garber
*Assistant Examiner* — Abdulfattah Mustapha
(74) *Attorney, Agent, or Firm* — Vierra Magen Marcus & DeNiro LLP

(57) ABSTRACT

A method for fabricating non-volatile storage having individually controllable shield plates between storage elements. The shield plates are formed by depositing a conductive material such as doped polysilicon between storage elements and their associated word lines, and providing contacts for the shield plates. The shield plates reduce electromagnetic coupling between floating gates of the storage elements, and can be used to optimize programming, read and erase operations. In one approach, the shield plates provide a field induced conductivity between storage elements in a NAND string during a sense operation so that source/drain implants are not needed in the substrate. In some control schemes, alternating high and low voltages are applied to the shield plates. In other control schemes, a common voltage is applied to the shield plates.

21 Claims, 15 Drawing Sheets

U.S. PATENT DOCUMENTS

| | | |
|---|---|---|
| 2003/0094635 A1 | 5/2003 | Yaegashi |
| 2004/0012988 A1 | 1/2004 | Kranister et al. |
| 2005/0072999 A1 | 4/2005 | Matami et al. |
| 2005/0180186 A1 | 8/2005 | Lutze |
| 2005/0199939 A1 | 9/2005 | Lutze |
| 2005/0242377 A1 | 11/2005 | Eguchi |
| 2006/0039230 A1 | 2/2006 | Kurata |
| 2006/0108628 A1 | 5/2006 | Hung |
| 2006/0120155 A1 | 6/2006 | Sato |
| 2006/0145241 A1 | 7/2006 | Forbes |
| 2007/0138535 A1 | 6/2007 | Higashitani |
| 2007/0141780 A1 | 6/2007 | Higashitani |
| 2007/0252209 A1 | 11/2007 | Yamazaki |
| 2008/0160680 A1 | 7/2008 | Yuan |

OTHER PUBLICATIONS

Choi, "A novel booster plate technology in high density NAND flash memories for voltage scaling-down and zero program disturbance," 1996 Symposium on VLSI Technology Digest of Technical Papers, pp. 238-239.

Kim, "Fast parallel programming of multi-level NAND flash memory cells using the booster-line technology," 1997 Symposium on VLSI Technology Digest of Technical Papers, pp. 65-66.

Satoh, "A novel channel boost capacitance (CBC) cell technology with low program disturbance suitable for fast programming 4Gbit NAND Flash memories," 1998 Symposium on VLSI Technology Digest of Technical Papers, pp. 108-109.

Office Action dated Mar. 4, 2009, U.S. Appl. No. 11/767,647, filed Jun. 25, 2007.

Response to Office Action dated Apr. 7, 2009, U.S. Appl. No. 11/767,647, filed Jun. 25, 2007.

Office Action dated Jun. 17, 2009, U.S. Appl. No. 11/767,647, filed Jun. 25, 2007.

Response to Office Action dated Jul. 1, 2009, U.S. Appl. No. 11/767,647, filed Jun. 25, 2007.

Notice of Allowance and Fee(s) Due, U.S. Appl. No. 11/767,647, filed Jun. 25, 2007.

Office Action dated Apr. 22, 2009, U.S. Appl. No. 11/767,652, filed Jun. 25, 2007.

Response to Office Action dated May 12, 2009, U.S. Appl. No. 11/767,652, filed Jun. 25, 2007.

Office Action dated Sep. 17, 2009, U.S. Appl. No. 11/767,652, filed Jun. 25, 2007.

Response to Office Action dated Dec. 17, 2009, U.S. Appl. No. 11/767,652, filed Jun. 25, 2007.

Office Action dated Mar. 16, 2010, U.S. Appl. No. 11/767,652, filed Jun. 25, 2007.

Response to Office Action dated Apr. 12, 2010, U.S. Appl. No. 11/767,652, filed Jun. 25, 2007.

Notice of Allowance and Fee(s) Due dated Jun. 4, 2010, U.S. Appl. No. 11/767,652, filed Jun. 25, 2007.

Restriction Requirement dated Mar. 23, 2009, U.S. Appl. No. 11/767,661, filed Jun. 25, 2007.

Response to Restriction Requirement dated Apr. 10, 2009, U.S. Appl. No. 11/767,661, filed Jun. 25, 2007.

Office Action dated Jul. 8, 2009, U.S. Appl. No. 11/767,661, filed Jun. 25, 2007.

Response to Office Action dated Jul. 8, 2009, U.S. Appl. No. 11/767,661, filed Jun. 25, 2007.

Office Action dated Dec. 30, 2009, U.S. Appl. No. 11/767,661, filed Jun. 25, 2007.

Response to Office Action dated Mar. 30, 2010, U.S. Appl. No. 11/767,661, filed Jun. 25, 2007.

Notice of Allowance and Fee(s) Due dated Apr. 19, 2010, U.S. Appl. No. 11/767,661, filed Jun. 25, 2007.

International Search Report & The Written Opinion of the International Searching Authority dated Sep. 25, 2008, International Application No. PCT.US2008/068048 filed Jun. 24, 2008.

International Preliminary Report on Patentability dated Jan. 5, 2010, International Application No. PCT/US2008/068048 filed Jun. 24, 2008.

* cited by examiner

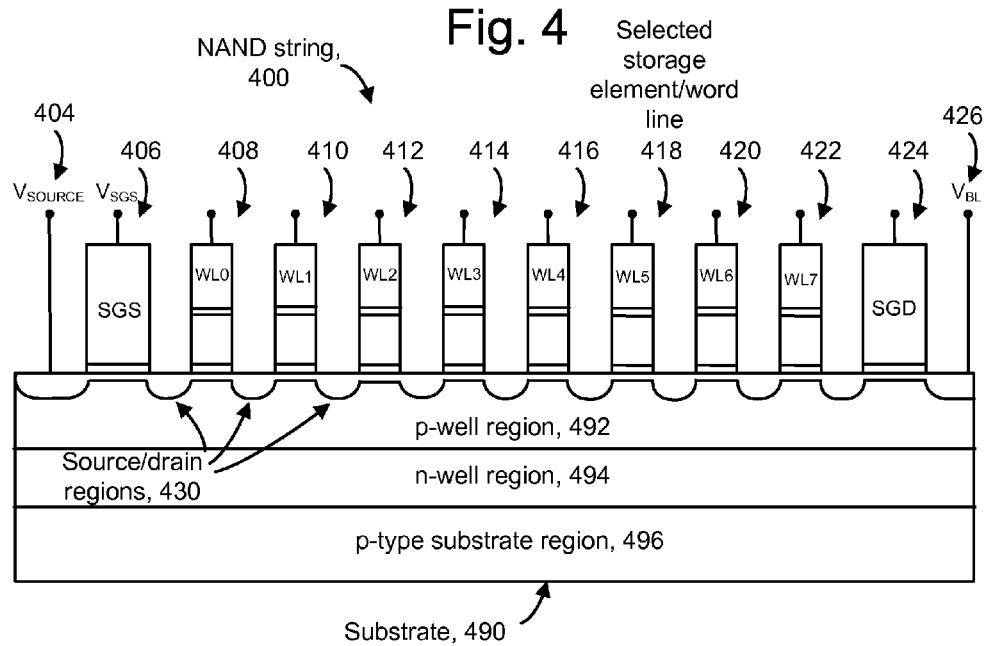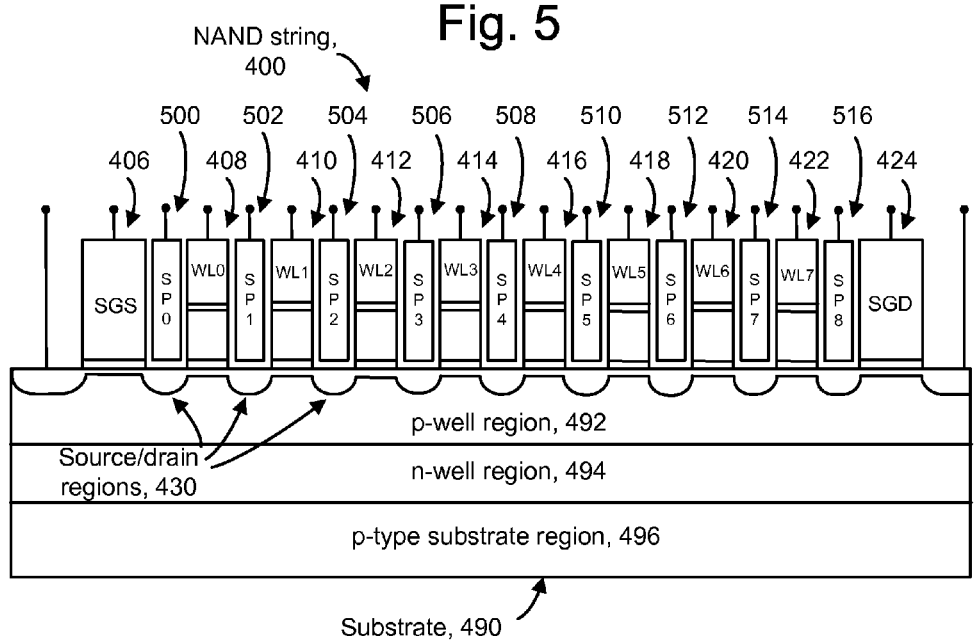

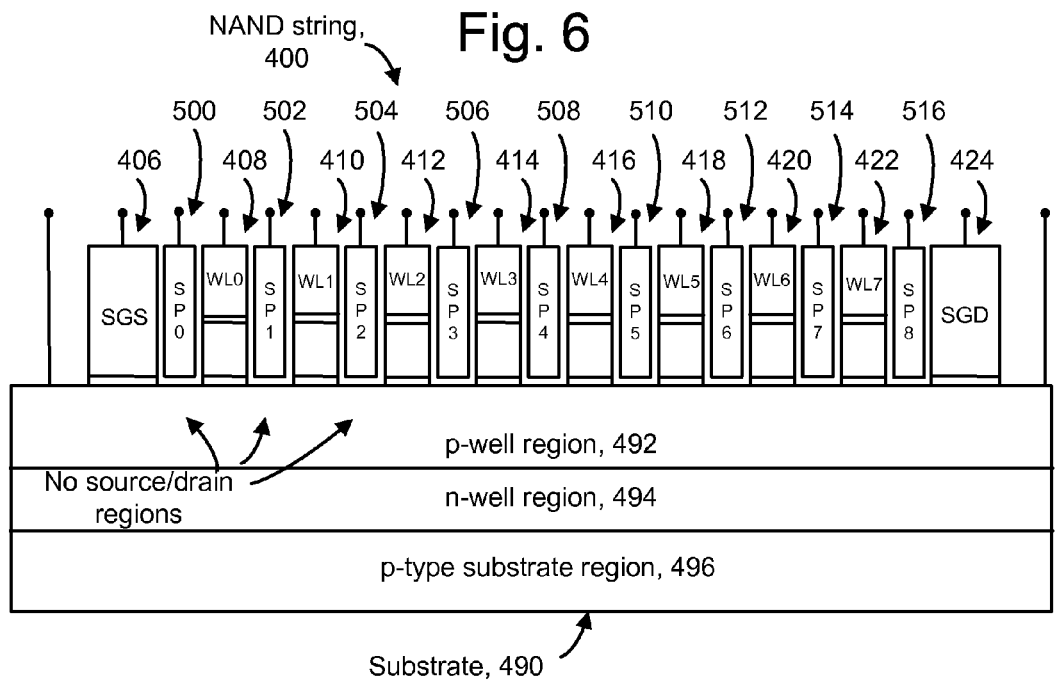
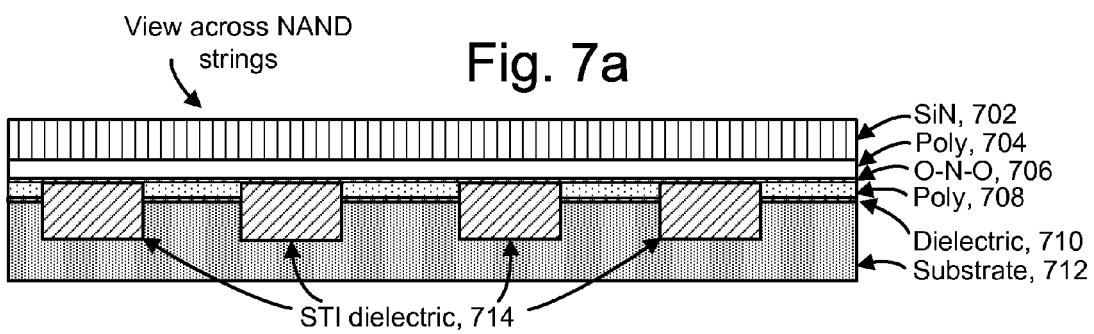
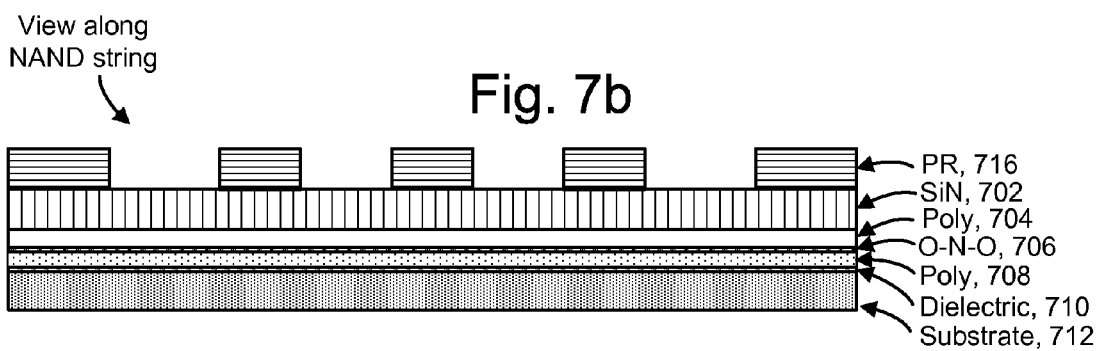

METHOD FOR FABRICATING NON-VOLATILE STORAGE WITH INDIVIDUALLY CONTROLLABLE SHIELD PLATES BETWEEN STORAGE ELEMENTS

CROSS-REFERENCE TO RELATED APPLICATIONS

This is a divisional application of U.S. patent application Ser. No. 11/767,661, filed Jun. 25, 2007 published as US 2008/0318379 on Dec. 25, 2008, and issued as U.S. Pat. No. 7,781,286 on Aug. 24, 2010, incorporated herein by reference.

This application is related to commonly assigned U.S. Pat. No. 7,636,260, issued Dec. 22, 2009, titled "Method For Operating Non-Volatile Storage With Individually Controllable Shield Plates Between Storage Elements," U.S. patent application Ser. No. 11/767,652, filed Jun. 25, 2007, titled "Non-Volatile Storage With Individually Controllable Shield Plates Between Storage Elements," issued as U.S. Pat. Ser. No. 7,808,826 on Oct. 5, 2010.

BACKGROUND OF THE INVENTION

1. Field of the Invention

The present invention relates to non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. 6,859,397, titled "Source Side Self Boosting Technique For Non-Volatile Memory," and in U.S. Patent Application Publication 2005/0024939, titled "Detecting Over Programmed Memory," published Feb. 3, 2005, issued as U.S. Pat. Ser. No. 6,917,542 on Jul. 12, 2005; both of which are incorporated herein by reference in their entirety.

However, as device dimensions are scaled down, various challenges arise. For example, floating gate-to-floating gate coupling becomes more problematic, resulting in a widened threshold voltage distribution and a reduced coupling ratio from the control gate to the floating gate.

SUMMARY OF THE INVENTION

The present invention addresses the above and other issues by providing a method for fabricating non-volatile storage having individually controllable shield plates between storage elements.

In one embodiment, a method for fabricating non-volatile storage includes: (a) forming a plurality of non-volatile storage elements on a substrate, the plurality of non-volatile storage elements are arranged in first and second sets, (b) forming a plurality of word lines in communication with the plurality of non-volatile storage elements of the first and second sets, (c) forming a first plurality of shield plates, each shield plate of the first plurality of shield plates extends between different adjacent non-volatile storage elements which are associated with adjacent word lines of the first set, and (d) forming a second plurality of shield plates, each shield plate of the second plurality of shield plates extends between different adjacent non-volatile storage elements which are associated with adjacent word lines of the second set, pairs of shield plates are coupled by an associated conductive path, each pair of shield plates comprises a shield plate in the first set and an associated shield plate in the second set.

In another embodiment, a method for fabricating non-volatile storage includes: (a) forming a plurality of non-volatile storage elements on a substrate, the plurality of non-volatile storage elements are arranged in first and second sets, (b) forming a plurality of word lines in communication with the plurality of non-volatile storage elements of the first and second sets, (c) forming a first plurality of shield plates, each shield plate of the first plurality of shield plates extends between different adjacent non-volatile storage elements which are associated with adjacent word lines of the first set, is electrically conductive and is independently controllable, and (d) forming a second plurality of shield plates, each shield plate of the second plurality of shield plates extends between different adjacent non-volatile storage elements which are associated with adjacent word lines of the second set, is electrically conductive and is independently controllable.

BRIEF DESCRIPTION OF THE DRAWINGS

FIG. 4 depicts a cross-sectional view of a NAND string.

FIG. 5 depicts a cross-sectional view of a NAND string with shield plates, where source/drain regions are provided in the substrate between storage elements.

FIG. 6 depicts a cross-sectional, view of a NAND string with shield plates, where source/drain regions are not provided in the substrate between storage elements.

FIG. 7a depicts a layered semiconductor device, showing a cross-sectional view across NAND strings.

FIG. 7b depicts a view along a NAND string of the layered semiconductor device of FIG. 7a, where a photoresist layer is applied and patterned.

DETAILED DESCRIPTION

The present invention provides a method for fabricating non-volatile storage having individually controllable shield plates between storage elements.

Figure 1:
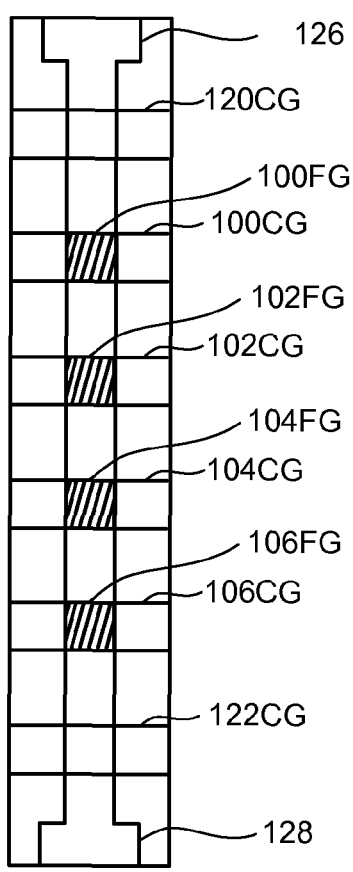
FIG. 1 is a top view of a NAND string.
Figure 2:
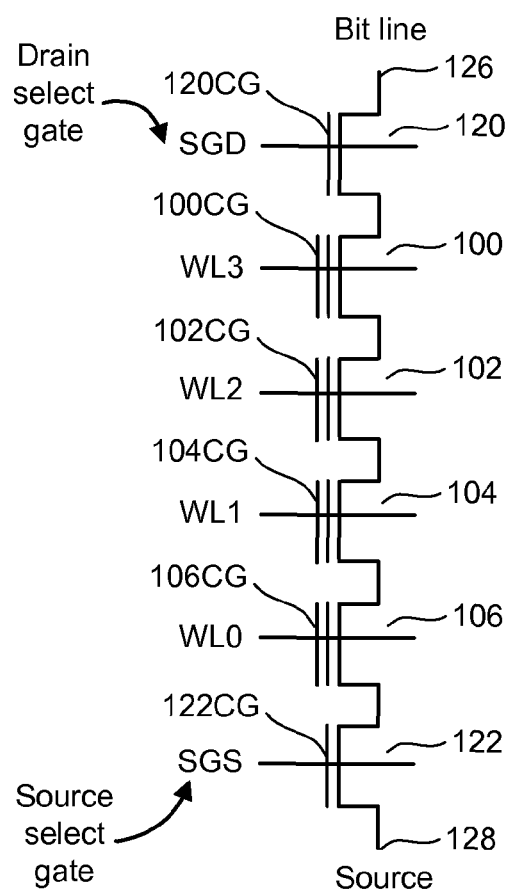
FIG. 2 is an equivalent circuit diagram of the NAND string of FIG. 1.

One example of a memory system suitable for implementing the present invention uses the NAND flash memory structure, which includes arranging multiple transistors in series between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors, 100, 102, 104 and 106, in series and sandwiched between a first select gate 120 and a second select gate 122. Select gate 120 gates the NAND string connection to bit line 126. Select gate 122 gates the NAND string connection to source line 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gate 100CG is connected to (or is provided by a portion of) word line WL3, control gate 102CG is connected to word line WL2, control gate 104CG is connected to word line WL1, and control gate 106CG is connected to word line WL0. In one embodiment, transistors 100, 102, 104 and 106 are each storage elements, also referred to as memory cells. In other embodiments, the storage elements may include multiple transistors or may be different than that depicted in FIGS. 1 and 2. Select gate 120 is connected to select line SGD. Select gate 122 is connected to select line SGS.

Figure 3:
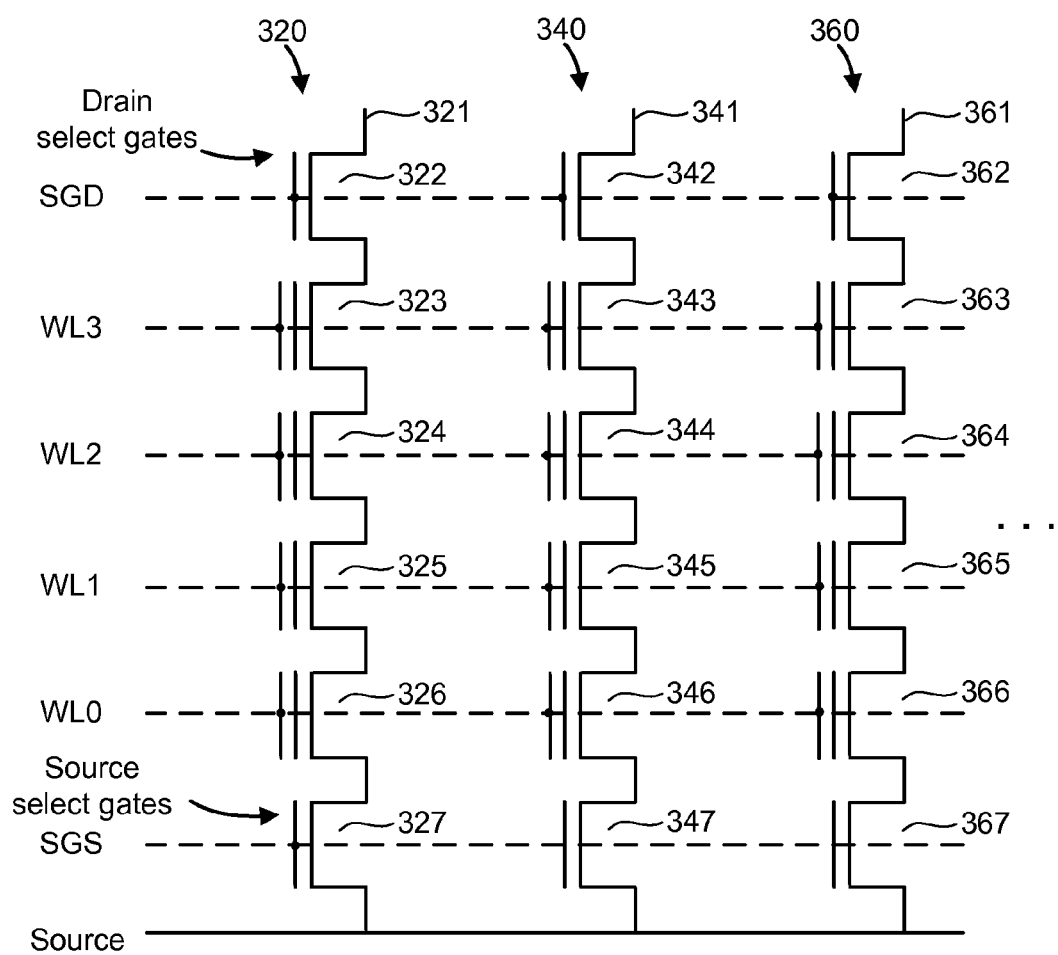
FIG. 3 is a block diagram of an array of NAND flash storage elements.

FIG. 3 is a circuit diagram depicting three NAND strings. A typical architecture for a flash memory system using a NAND structure will include several NAND strings. For example, three NAND strings 320, 340 and 360 are shown in a memory array having many more NAND strings. Each of the NAND strings includes two select gates and four storage elements. While four storage elements are illustrated for simplicity, modern NAND strings can have up to thirty-two or sixty-four storage elements, for instance.

For example, NAND string 320 includes select gates 322 and 327, and storage elements 323-326, NAND string 340 includes select gates 342 and 347, and storage elements 343-346, NAND string 360 includes select gates 362 and 367, and storage elements 363-366. Each NAND string is connected to the source line by its select gates (e.g., select gates 327, 347 or 367). A selection line SGS is used to control the source side select gates. The various NAND strings 320, 340 and 360 are connected to respective bit lines 321, 341 and 361, by select transistors in the select gates 322, 342, 362, etc. These select transistors are controlled by a drain select line SGD. In other embodiments, the select lines do not necessarily need to be in common among the NAND strings; that is, different select lines can be provided for different NAND strings. Word line WL3 is connected to the control gates for storage elements 323, 343 and 363. Word line WL2 is connected to the control gates for storage elements 324, 344 and 364. Word line WL1 is connected to the control gates for storage elements 325, 345 and 365. Word line WL0 is connected to the control gates for storage elements 326, 346 and 366. Each bit line and the respective NAND string comprise the columns of the array or set of storage elements. The word lines (WL3, WL2, WL1 and WL0) comprise the rows of the array or set. Each word line connects the control gates of each storage element in the row. Or, the control gates may be provided by the word lines themselves. For example, word line WL2 provides the control gates for storage elements 324, 344 and 364. In practice, there can be thousands of storage elements on a word line.

Each storage element can store data. For example, when storing one bit of digital data, the range of possible threshold voltages ($V_{TH}$) of the storage element is divided into two ranges which are assigned logical data "1" and "0." In one example of a NAND type flash memory, the $V_{TH}$ is negative after the storage element is erased, and defined as logic "1." The $V_{TH}$ after a program operation is positive and defined as logic "0." When the $V_{TH}$ is negative and a read is attempted, the storage element will turn on to indicate logic "1" is being stored. When the $V_{TH}$ is positive and a read operation is attempted, the storage element will not turn on, which indicates that logic "0" is stored. A storage element can also store multiple levels of information, for example, multiple bits of digital data. In this case, the range of $V_{TH}$ value is divided into the number of levels of data. For example, if four levels of information are stored, there will be four $V_{TH}$ ranges assigned to the data values "11", "10", "01", and "00." In one example of a NAND type memory, the $V_{TH}$ after an erase operation is negative and defined as "11". Positive $V_{TH}$ values are used for the states of "10", "01", and "00." The specific relationship between the data programmed into the storage element and the threshold voltage ranges of the element depends upon the data encoding scheme adopted for the storage elements. For example, U.S. Pat. No. 6,222,762 and U.S. Patent Application Pub. 2004/0255090, both of which are incorporated herein by reference in their entirety, describe various data encoding schemes for multi-state flash storage elements.

Relevant examples of NAND type flash memories and their operation are provided in U.S. Pat. Nos. 5,386,422, 5,570, 315, 5,774,397, 6,046,935, 6,456,528 and 6,522,580, each of which is incorporated herein by reference.

When programming a flash storage element, a program voltage is applied to the control gate of the storage element, and the bit line associated with the storage element is grounded. Electrons from the channel are injected into the floating gate. When electrons accumulate in the floating gate, the floating gate becomes negatively charged and the $V_{TH}$ of the storage element is raised. To apply the program voltage to the control gate of the storage element being programmed, that program voltage is applied on the appropriate word line. As discussed above, one storage element in each of the NAND strings share the same word line. For example, when programming storage element 324 of FIG. 3, the program voltage will also be applied to the control gates of storage elements 344 and 364.

However, program disturb can occur at inhibited NAND strings during programming of other NAND strings, and sometimes at the programmed NAND string itself. Program disturb occurs when the threshold voltage of an unselected non-volatile storage element is shifted due to programming of other non-volatile storage elements. Program disturb can occur on previously programmed storage elements as well as erased storage elements that have not yet been programmed. Various program disturb mechanisms can limit the available operating window for non-volatile storage devices such as NAND flash memory.

For example, if NAND string 320 is inhibited (e.g., it is an unselected NAND string which does not contain a storage element which is currently being programmed) and NAND string 340 is being programmed (e.g., it is a selected NAND string which contains a storage element which is currently being programmed), program disturb can occur at NAND string 320. For example, if a pass voltage, $V_{PASS}$, is low, the channel of the inhibited NAND string is not well boosted, and a selected word line of the unselected NAND string can be unintentionally programmed. In another possible scenario, the boosted voltage can be lowered by Gate Induced Drain Leakage (GIDL) or other leakage mechanisms, resulting in the same problem. Other effects, such as shifts in the $V_{TH}$ of a charge storage element due to capacitive coupling with other neighboring storage elements that are programmed later, can also contribute to program disturb. Program disturb can be reduced by the shield plate configuration and control techniques described herein.

FIG. 4 depicts a cross-sectional view of a NAND string. The view is simplified and not to scale. The NAND string 400 includes a source-side select gate 406, a drain-side, select gate 424, and eight storage elements 408, 410, 412, 414, 416, 418, 420 and 422, formed on a substrate 490. The components can be formed on a p-well region 492 which itself is formed in an n-well region 494 of a p-type substrate region 496. The regions collectively are part of a substrate 490. The n-well can in turn be formed in a p-substrate. A source supply line 404 with a potential of $V_{SOURCE}$ is provided in addition to a bit line 426 with a potential of $V_{BL}$. The word lines receive respective voltages according to operation which is being performed, e.g., programming, sensing (read or verify) or erasing. Further, recall that the control gate of a storage element may be provided as a portion of the word line. For example, WL0, WL1, WL2, WL3, WL4, WL5, WL6 and WL7 can extend via the control gates of storage elements 408, 410, 412, 414, 416, 418, 420 and 422, respectively. Source/drain regions, examples of which are shown at 430, are provided between the storage elements by doping the p-well region 492 after the storage elements are formed, in one approach. The source side of a word line or non-volatile storage element refers to the side which faces the source end of the NAND string, e.g., at source supply line 404, while the drain side of a word line or non-volatile storage element refers to the side which faces the drain end of the NAND string, e.g., at bit line 426.

FIG. 5 depicts a cross-sectional view of a NAND string with shield plates, where source/drain regions are provided in the substrate between storage elements. Here, a number of shield plates are provided from a conductive material to provide shielding of electromagnetic radiation between the floating gates of adjacent non-volatile storage elements. The conductive material may include a metal, such as W or Ta, which may be used with a barrier metal, such as WN, TaN or TiN.

The conductive material may include doped polysilicon or silicide such as WSi, TiSi, CoSi or NiSi. For example, shield plate SP0 500 is provided between SGS 406 and storage element 408, shield plate SP1 502 is provided between storage elements 408 and 410, shield plate SP2 504 is provided between storage elements 410 and 412, shield plate SP3 506 is provided between storage elements 412 and 414, shield plate SP4 508 is provided between storage elements 414 and 416, shield plate SP5 510 is provided between storage elements 416 and 418, shield plate SP6 512 is provided between storage elements 418 and 420, shield plate SP7 514 is provided between storage elements 420 and 422, and shield plate SP8 516 is provided between storage element 422 and SGD 424. Each shield plate or member can be located between the floating gates of adjacent storage elements which are associated with adjacent word lines. This configuration reduces floating gate-to-floating gate coupling during read or program operations, for instance. Note that it is not necessary for the shield plate to extend to the top of the storage elements/word lines as depicted. However, each shield plate can extend to the top of the storage elements/word lines or beyond to reduce control gate/word line-to-floating gate coupling as well. The shield plates may have a generally rectangular cross section, in one approach.

The shield plates can be independently controllable to optimize their effect during programming, sensing (read/verify) and erase operations by coupling a desired voltage to each shield plate. This is an advantage over approaches which uses commonly controllable shield plates. Further, the shield plates can allow the use of reduced program voltages since they can provide some coupling of voltage to the floating gate of a storage element being programmed. As a result, program disturb is reduced.

FIG. 6 depicts a cross-sectional view of a NAND string with shield plates, where source/drain regions are not provided in the substrate between storage elements. In one embodiment, it is not necessary to provide source/drain regions in the p-well region 492 of the substrate since a field induced conductivity between storage elements can be provided due to the shield plates. For example, during sensing operations, such as reading or verifying, a conductive path can be established in a NAND string when a selected storage element is in an on/conductive state. Such a conductive path can be established between the bit line contact and the cell source contact via a channel formed by the drain select gate, shield plates, word lines/control gates and source select gate, e.g., from the select gate SGD 424 to SP8 516, to WL7, to SP7 514, to WL6, to SP6 512, and so forth, until the select gate SGS 406 and source are reached. Essentially, a virtual junction is formed between the storage elements when an appropriate voltage, such as about 4-5 V is applied to the shield plates and VSS=0 V, for instance, is applied to the word lines. The sensing operation thus does not rely on a conductive path in the substrate. Further, since the shield plates are independently controllable, their voltages can be adjusted optimally according to the control scheme. The use of such virtual junctions is also beneficial to prevent the short channel effect where source/drain regions are not provided. Moreover, avoiding the need for source/drain regions avoids the corresponding steps in the fabrication process.

In order to create virtual junctions by field induced conductivity between the storage elements and shield plates, a positive voltage is applied to the shield plates and storage elements. However, the shield plate voltages will affect the selected word line read voltage due to coupling of the shield plate voltages to the floating gates. The coupling will be proportional to the shield plate voltage×a coupling ratio C(SP-FG/total FG), which could be approximately 5 to 15%. If the shield plate voltage is high, the selected word line read voltage will increase. To reduce the virtual source-drain junction, a higher shield plate voltage should be used, while to reduce the selected word line read voltage, a lower shield plate voltage should be used. To address these conflicting goals, alternatingly higher and lower shield plate voltages (VRSPH and VRSPL, respectively) can be used on alternate shield plates, in one possible approach. However, it is also possible use a common shield plate voltage (VRSP) on all shield plates.

A process for fabricating a non-volatile storage device with shield plates is now discussed.

FIG. 7a depicts a layered semiconductor device, showing a cross-sectional view across NAND strings. An intermediate stage of fabrication is depicted. The formation of the device up to this point may follow a conventional technique where a first dielectric layer 710 (e.g., a gate oxide layer) is formed over a substrate 712 and subsequently a first polysilicon (poly) layer 708 is formed over the first dielectric layer 710. The first polysilicon layer 708, which is doped so that it is electrically conductive, is used to form the floating gates of the storage elements. Shallow trench isolation (STI) structures 714 are formed by patterning the substrate 712 and etching trenches through the first polysilicon layer 708 and the first dielectric layer 710. The trenches also extend into the substrate 712. The trenches are filled with STI material (a suitable dielectric material such as $SiO_2$) to provide electrical insulation between NAND strings. Thus, strips of STI material form STI structures 714 that extend across the substrate 712 (in a direction perpendicular to the cross section of the figure) separated by strips of the first polysilicon layer 708.

Subsequently, a second dielectric layer 706 such as an O—N—O layer is provided on the poly layer 708. An O—N—O layer is a triple layer dielectric formed of silicon oxide, silicon nitride and silicon oxide. A second polysilicon layer 704 is deposited that overlies the STI structures 714 and the strips of first polysilicon material 708. The second polysilicon layer 704, which is also doped and electrically conductive, is separated from the strips of the first polysilicon 710 by the second dielectric layer 706. The second polysilicon layer 704 is used to form the word lines and the control gates of the storage elements. A masking layer 702 is formed over the second polysilicon layer 704. In this case, the masking layer 702 is formed of a dielectric such as Silicon Nitride (SiN), although other suitable masking materials may also be used.

FIG. 7b depicts a view along a NAND string of the layered semiconductor device of FIG. 7a, where a photoresist layer is applied and patterned. FIG. 7b shows a cross section of the NAND array of FIG. 7a along a direction that is at right angles to the cross section of FIG. 7a. Thus, FIG. 7b shows a single strip of the first polysilicon material 708 in cross section with the second polysilicon layer 704 overlying the strip. FIG. 7b also shows portions of a photoresist (PR) overlying the masking layer 702. The patterned photoresist layer 716 is formed by applying a blanket layer of photoresist and then patterning the photoresist using a lithographic process. In one approach, the photoresist is patterned by being exposed to UV light, although other patterning processes such as e-beam lithography may also be used.

Figure 7C:
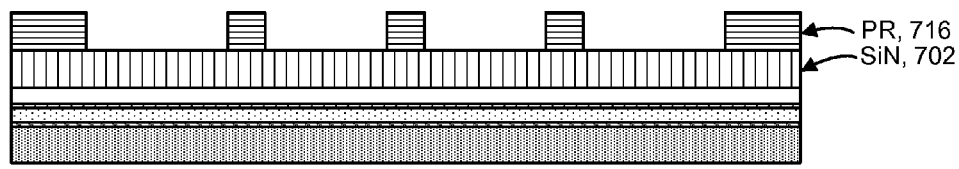
FIG. 7c depicts the layered semiconductor device of FIG. 7b, after photoresist slimming.

FIG. 7c depicts the layered semiconductor device of FIG. 7b, after photoresist slimming. Resist slimming involves subjecting portions of the photoresist to etching to remove at least some photoresist and to make portions of the photoresist narrower. A conventional etch such as a dry etch may be used for this step.

Figure 7D:
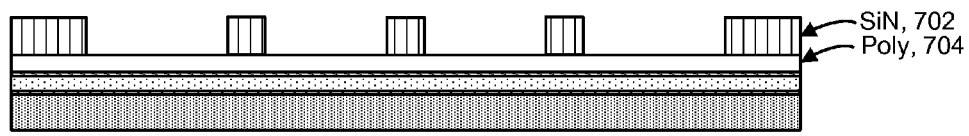
FIG. 7d depicts the layered semiconductor device of FIG. 7c, after SiN etching and photoresist stripping.

FIG. 7d depicts the layered semiconductor device of FIG. 7c, after SiN etching and, photoresist stripping. Subsequent to resist slimming, the slimmed portions of photoresist are used to pattern the underlying SiN masking layer 702. An etch is performed so that unexposed portions of the masking layer 702 are removed. The remaining portions of the photoresist 716 are then removed. FIG. 7d shows the resulting structure along the same cross section as FIG. 7c. The etch stops when the second polysilicon layer 704 is reached.

Figure 7E:
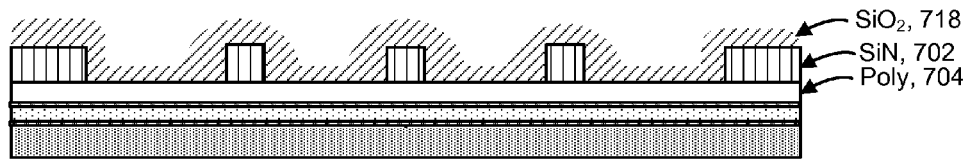
FIG. 7e depicts the layered semiconductor device of FIG. 7d, after $SiO_2$ deposition.

FIG. 7e depicts the layered semiconductor device of FIG. 7d, after silicon dioxide ($SiO_2$) deposition. An $SiO_2$ layer 718 is formed as a third dielectric layer that overlies the masking portions of the SiN layer 702 and the exposed areas of the second polysilicon layer 704. The $SiO_2$ layer 718, which may be formed as a blanket layer by a conventional process such as Chemical Vapor Deposition (CVD), can be a thicker than the dielectric layers 706 and 710, in one approach. The $SiO_2$ layer 718 extends along exposed portions of the second polysilicon and along the top surfaces and sidewalls of the masking portions 702.

Figure 7F:
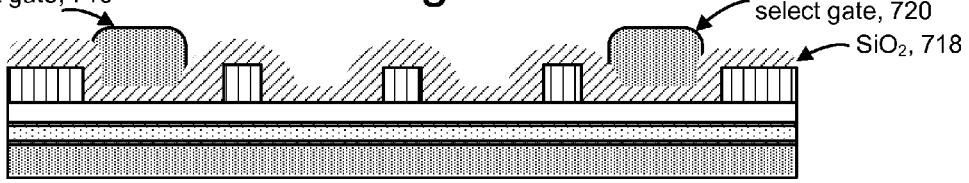
FIG. 7f depicts the layered semiconductor device of FIG. 7e, after a photoresist mask for select gates is provided.

FIG. 7f depicts the layered semiconductor device of FIG. 7e, after a photoresist mask for select gates is provided. The photoresist portions 719 and 720 of the mask may be formed by covering the structure with photoresist, then patterning the photoresist using a lithographic process to remove unwanted portions of photoresist. The photoresist portions 719 and 720 extend over portions of $SiO_2$ layer 718 that directly overlie the second polysilicon layer 704. An etch is then performed to remove certain exposed portions of the $SiO_2$ layer 718. The photoresist mask may also be used for areas in which word line and shield plate contacts are subsequently formed.

Figure 7G:
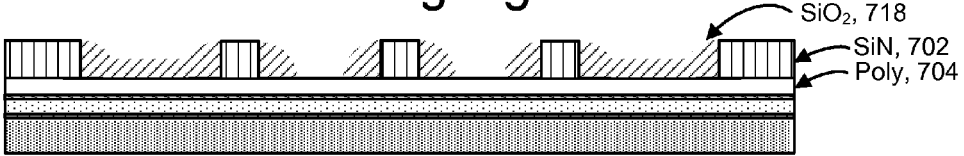
FIG. 7g depicts the layered semiconductor device of FIG. 7f, after $SiO_2$ etching and photoresist stripping.

FIG. 7g depicts the layered semiconductor device of FIG. 7f, after $SiO_2$ etching and photoresist stripping. In one approach, anisotropic etching such as Reactive Ion Etching (RIE) is used so that the $SiO_2$ layer 718 is etched through in some places but portions of the $SiO_2$ layer 718 remain along sidewalls of the SiN masking portions 702 as sidewall spacers. The dimensions of the sidewall spacers are determined by the thickness of $SiO_2$ layer 718 and by the nature of the anisotropic etch used. After the etch is completed, a photoresist strip is also performed to remove photoresist portions 719 and 720. The sidewall spacers, which subsequently establish the locations of select gate lines and word lines, and do not require separate alignment.

Figure 7H:
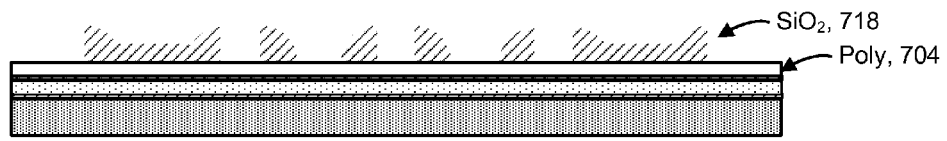
FIG. 7h depicts the layered semiconductor device of FIG. 7g, after an SiN wet etch.

FIG. 7h depicts the layered semiconductor device of FIG. 7g, after a wet etch to remove the portions of the SiN layer 702, thereby leaving portions of the $SiO_2$ layer 718 in place overlying the second polysilicon layer 704. Subsequently, the remaining portions of the $SiO_2$ layer 718 are used as an etch mask to pattern underlying layers to form a memory array.

Figure 7I:
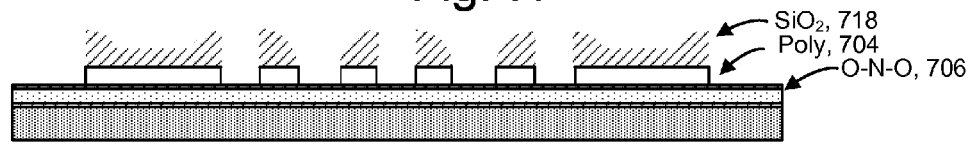
FIG. 7i depicts the layered semiconductor device of FIG. 7h, after a poly etch.

In particular, FIG. 7i depicts the layered semiconductor device of FIG. 7h, after an etch step is carried out to etch through the polysilicon layer 704, stopping at the O—N—O layer 706.

Figure 7J:
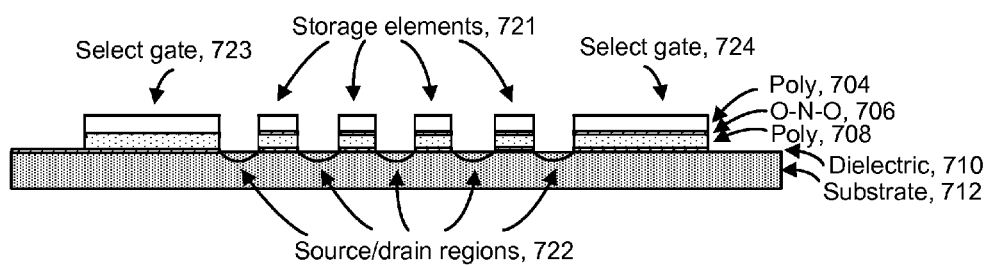
FIG. 7j depicts the layered semiconductor device of FIG. 7i, after an O—N—O and poly etch.

FIG. 7j depicts the layered semiconductor device of FIG. 7i, after an O—N—O and poly etch. Here, the O—N—O layer 706, polysilicon layer 708 and dielectric layer 710 are etched, stopping at the substrate 712. This etch step separates the polysilicon layer 704 into separate word lines, and separates the polysilicon layer 708 into separate floating gates. The word lines form control gates where they overlie floating gates in respective storage elements 721. Select gates 723 and 724 are similarly formed. Because the word lines and the floating gates are formed by the same etch step, they are self aligned. Source/drain regions 722 between the storage elements 721 can also be provided by implanting dopants into exposed areas of the substrate 712. These exposed areas lie between floating gates so that they connect storage elements of a NAND string in one approach.

Figure 7K:
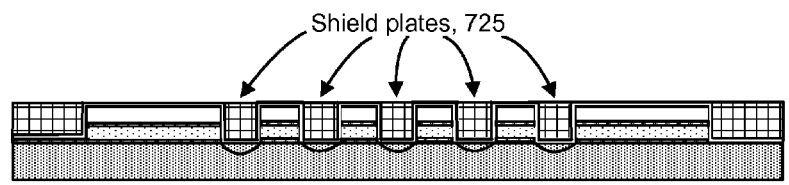
FIG. 7k depicts the layered semiconductor device of FIG. 7j, after shield plates are formed by poly deposition and CMP.

FIG. 7k depicts the layered semiconductor device of FIG. 7j, after shield plates are formed by poly deposition and chemical mechanical polishing (CMP). A dielectric layer 721 is deposited over the layered structure, and poly deposited over the dielectric layer. In an example implementation, the dielectric layer includes $SiO_2$, $SiO_2$—SiN—$SiO_2$, $SiO_2$—AlO—$SiO_2$ or $SiO_2$—HfO—$SiO_2$, has a physical thickness of about 9-12 nm and an effective thickness of about 7-11 nm. CMP is performed to planarize the surface. The poly may be doped to provided the desired conductivity. Subsequently, the memory array may be covered by a protective layer such as a thick dielectric layer or other protective material. The resulting structure includes shield plates 725 which are formed between adjacent storage elements, and between the select gates and the storage elements adjacent to the select gates. The shield plates 725 are insulated from one another and from the storage elements so that they are independently controllable. Each shield plate extends between different adjacent storage elements which are associated with adjacent word lines. The shield plates also extend transversely to the NAND strings. As a result, various optimized control modes can be provided during programming, read and erase operations as described further below.

In the above figures, a simplified example has been provided with only four storage elements in a NAND string. In practice, many more storage elements can be provided in a NAND string. Additionally, the fabrication process covers a wider area of the substrate so that many sets of NAND strings are formed on a common substrate. Further, not all details have been depicted, and the figures are not necessarily to scale. The following figures similarly do not necessarily depict all details. Further, note that the shading and patterns used do not necessarily correspond to the previous figures.

Figure 8A:
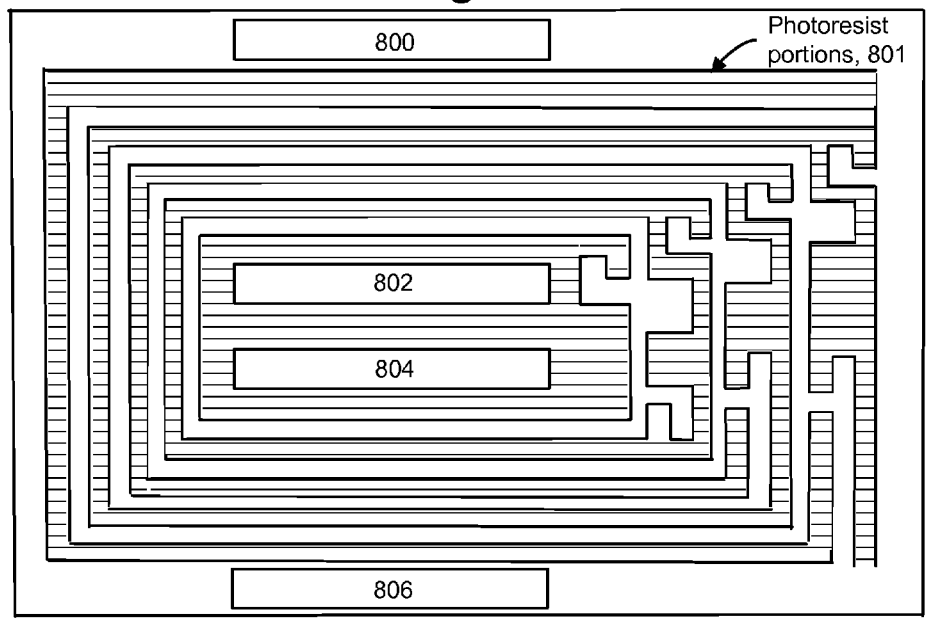
FIG. 8a depicts a top view of the layered semiconductor device of FIG. 7b.

FIG. 8a depicts a top or plan view of the layered semiconductor device of FIG. 7b. In this and the following figures, a region of the substrate is depicted which results in the formation of two sets of storage elements and associated word lines, shield plates and contacts. Each set of storage elements includes eight word lines and nine shield plates. Further, source select gates are provided in regions 802 and 804 while drain select gates are provided in regions 800 and 806. In particular, a patterned photoresist portion 801 is shown extending across the memory array to form a closed loop. In some memory arrays, several similar concentric loops may be used. Concentric openings are similarly formed between the photoresist portions 801, in addition to various openings which are subsequently used to provide word line and shield plate contacts.

Figure 8B:
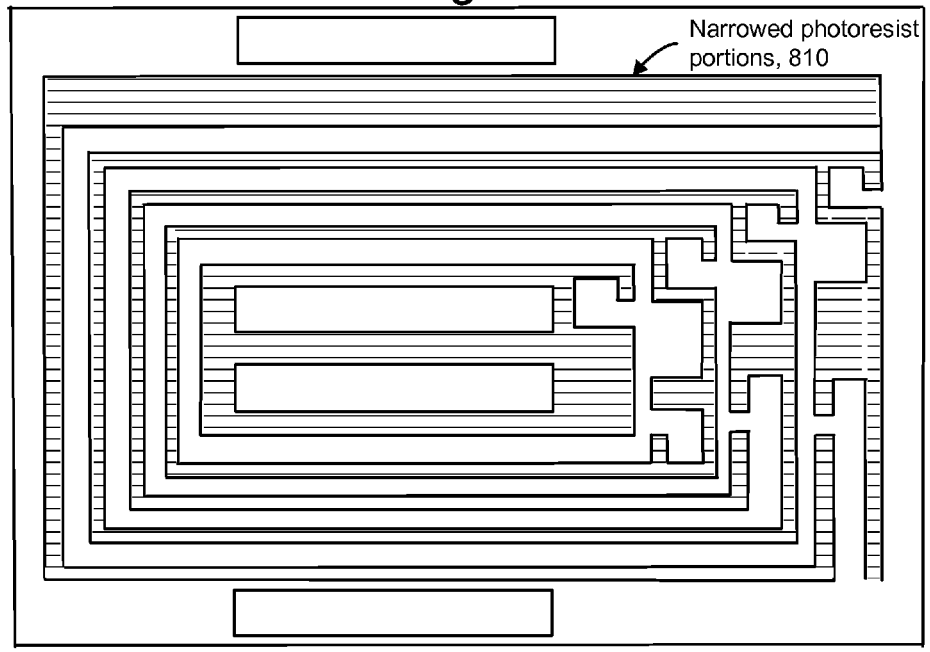
FIG. 8b depicts a top view of the layered semiconductor device of FIG. 7c.

FIG. 8b depicts a top view of the layered semiconductor device of FIG. 7c, after photoresist slimming is performed. As discussed, this results in narrowed photoresist portions 810.

Figure 8C:
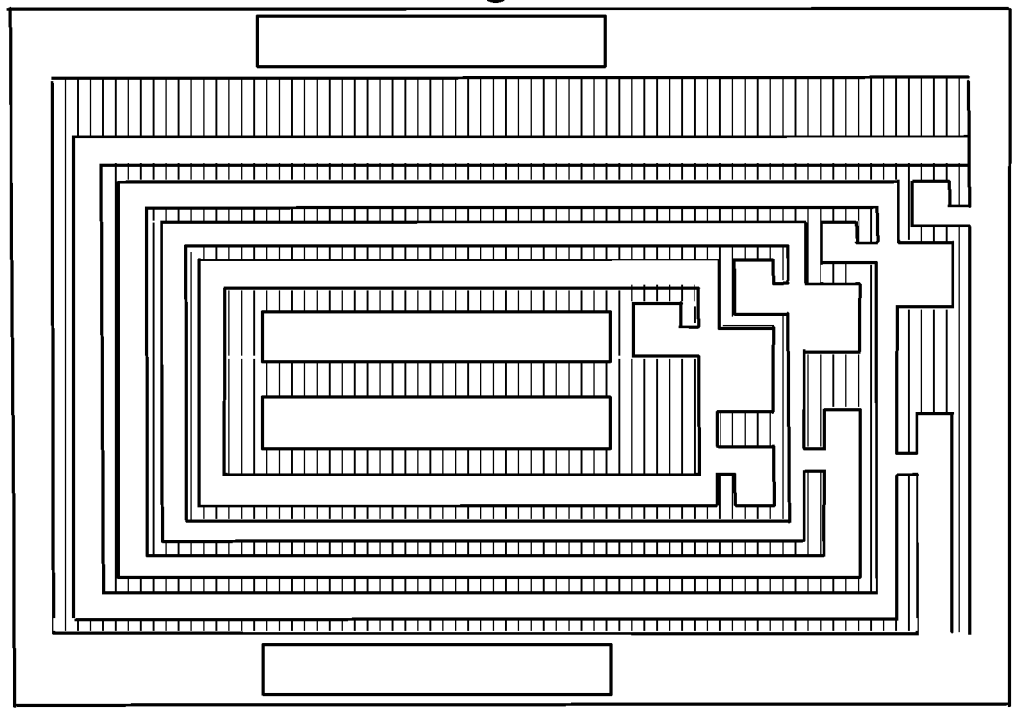
FIG. 8c depicts a top view of the layered semiconductor device of FIG. 7d.

FIG. 8c depicts a top view of the layered semiconductor device of FIG. 7d, after SiN etch and photoresist stripping. In this step, the SiN layer is patterned based on the photoresist layer and the photoresist layer is removed.

Figure 8D:
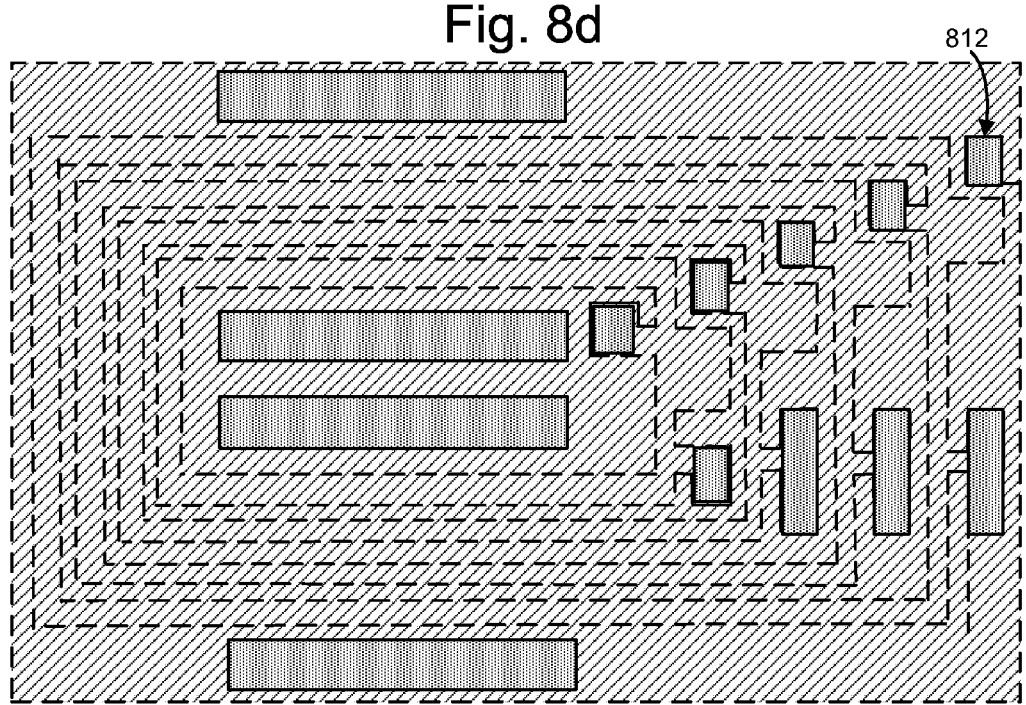
FIG. 8d depicts a top view of the layered semiconductor device of FIG. 7f.

FIG. 8d depicts a top view of the layered semiconductor device of FIG. 7f. $SiO_2$ deposition is performed across the layered structure and photoresist masks, such as example mask 810, are provided in areas for forming word line and shield plate contacts.

Figure 8E:
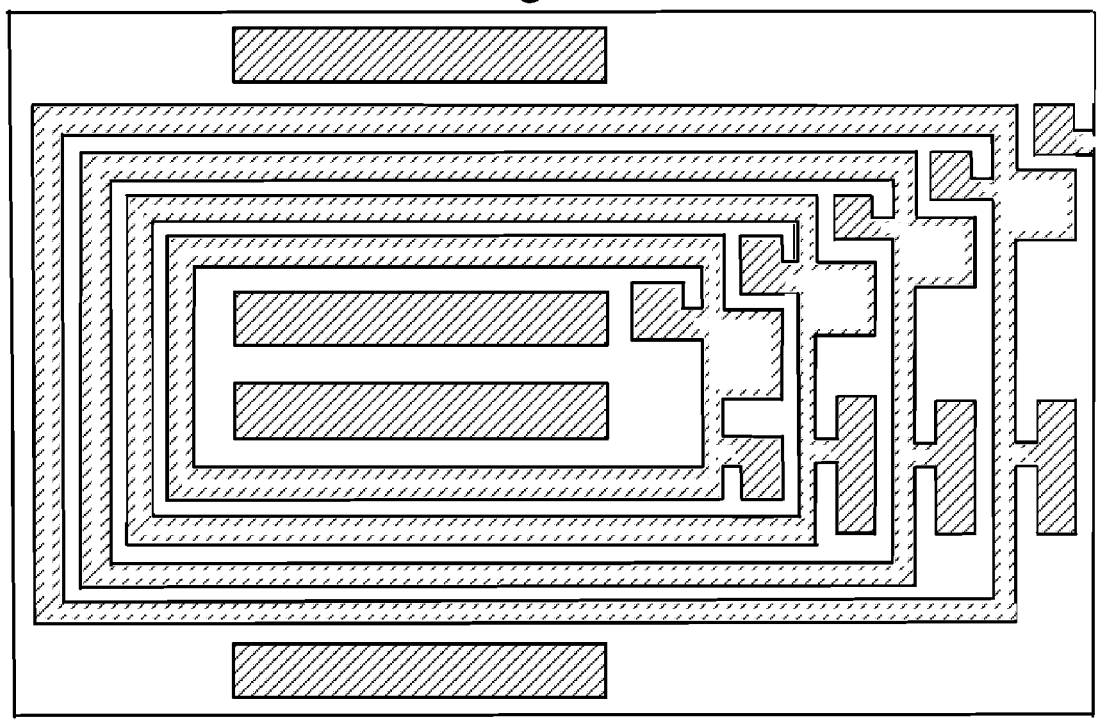
FIG. 8e depicts a top view of the layered semiconductor device of FIG. 7g.

FIG. 8e depicts a top view of the layered semiconductor device of FIG. 7g. $SiO_2$ etching and photoresist stripping is performed, leaving SiN portions and $SiO_2$ sidewall spacers.

Figure 8F:
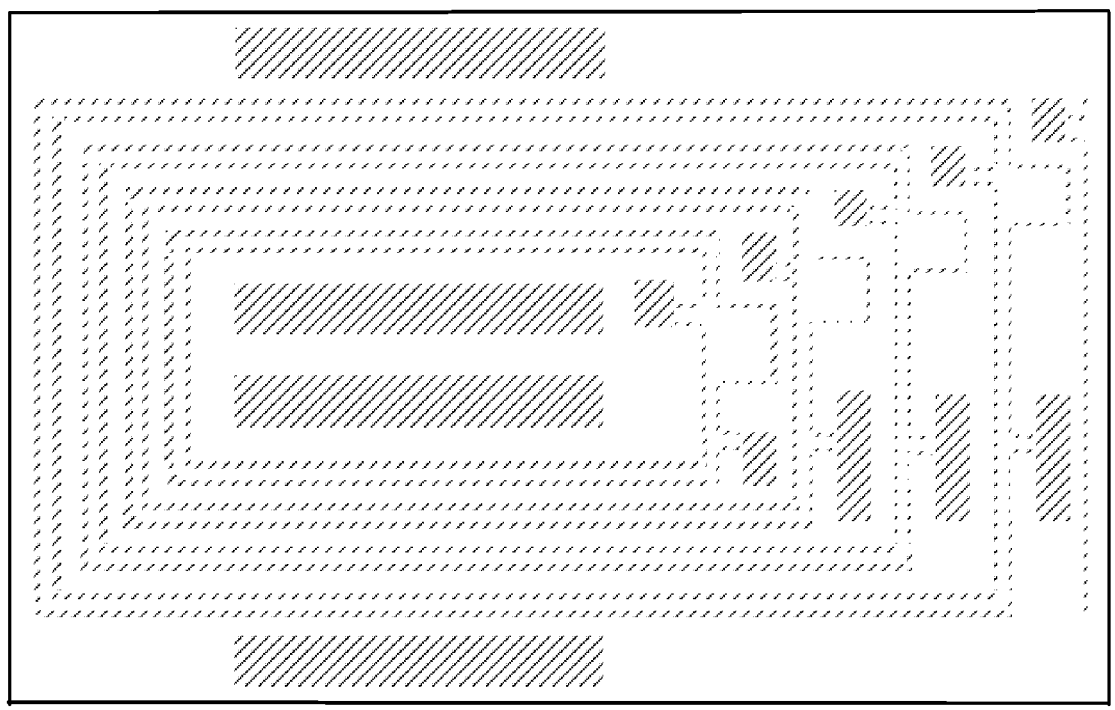
FIG. 8f depicts a top view of the layered semiconductor device of FIG. 7h.

FIG. 8*f* depicts a top view of the layered semiconductor device of FIG. 7*h*. The wet etch removes portions of the SiN layer, thereby leaving portions of the SiO$_2$ sidewall spacers.

Figure 8G:
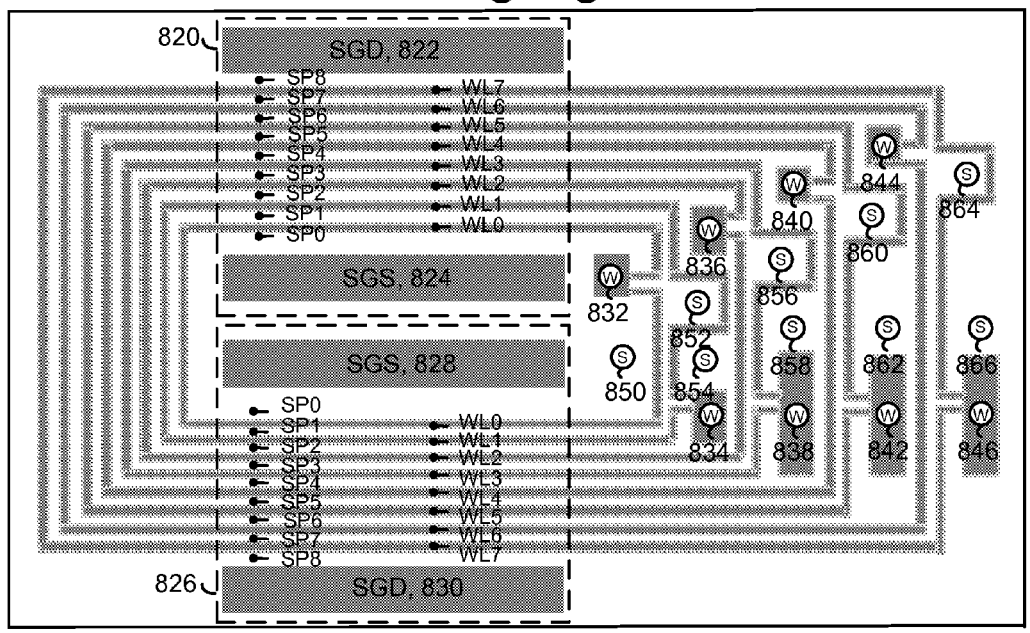
FIG. 8g depicts a top view of the layered semiconductor device formed from the device of FIG. 8f, showing word line contacts and shield plate contacts shared by two sets of storage elements.

FIG. 8*g* depicts a top view of the layered semiconductor device of formed from the device FIG. 8*f*, showing word line contacts and shield plate contacts shared by two sets of storage elements. After the processing depicted in FIGS. 7*i-k*, the word lines and shield plates are formed along with their contact points. In the figure, "W" denotes a word line contact and "S" denotes a shield plate contact. These are contact points at which different voltages can be coupled to the word lines or shield plates, respectively, according to a desired control scheme. For example, a first set of storage elements 820 includes a number of shield plates and word lines which extend alternately between a source select gate 824 and a drain select gate 822. Similarly, a second set of storage elements 826 includes a number of shield plates and word lines which extend alternately between a source select gate 828 and a drain select gate 830. The word lines are shared by the two sets of storage elements. For example, word line contact 832 is coupled to WL0, which extends in a circuit through both sets of storage elements. Likewise, word line contact 834 is coupled to WL1, word line contact 836 is coupled to WL2, word line contact 838 is coupled to WL3, word line contact 840 is coupled to WL4, word line contact 842 is coupled to WL5, word line contact 844 is coupled to WL6, and word line contact 846 is coupled to a last word line, WL7. Again, eight word lines are provided as an example only.

Similarly, the shield plates are shared by the two sets of storage elements. For example, shield plate contact 850 is coupled to a first shield plate, SP0, which extends in a circuit through both sets of storage elements. In particular, SP0 extends between SGS 824 and WL0 in the first set of storage elements 820, and between SGS 828 and WL0 in the second set of storage elements 826. Shield plate contact 852 is coupled to SP1, which extends between WL0 and WL1. Shield plate contact 854 is coupled to SP2, which extends between WL1 and WL2. Shield plate contact 856 is coupled to SP3, which extends between WL2 and WL3. Shield plate contact 858 is coupled to SP4, which extends between WL3 and WL4. Shield plate contact 860 is coupled to SP5, which extends between WL4 and WL5. Shield plate contact 862 is coupled to SP6, which extends between WL5 and WL6. Shield plate contact 864 is coupled to SP7, which extends between WL6 and WL7. Shield plate contact 866 is coupled to SP8, which extends between WL7 and SGD 822 in the first set of storage elements 820, and between WL7 and SGD 830 in the second set of storage elements 826.

In this configuration, voltages can be coupled independently to a given word line or shield plate which is shared among the two sets of storage elements 820 and 826. Appropriate control circuit can be used to couple desired voltages to the contacts.

Note that the arrangement shown is an example only as other arrangements are possible. For example, one or more additional sets of storage elements can be arranged at the left or right side of the sets of storage elements 820 and 826. In this case, the word lines that extend horizontally in the figure can extend further horizontally across the additional sets of storage elements. Further, one or more sets of storage elements could be provided in the region where the word lines extend vertically in the figure, for instance.

Figure 8H:
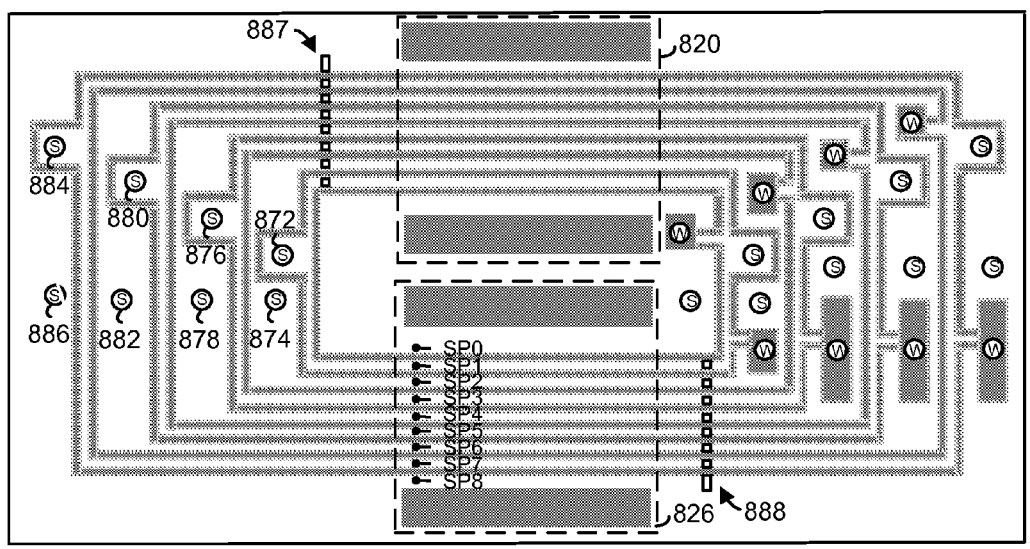
FIG. 8h depicts a top view of an alternative layered semiconductor device, showing shared word line contacts and separate shield plate contacts for each set of storage elements.

FIG. 8*h* depicts a top view of an alternative layered semiconductor device, showing shared word line contacts and separate shield plate contacts for each set of storage elements. In comparison to the configuration of FIG. 8*g*, additional shield plate contacts 872-886 are added at a side of the sets of storage elements 820 and 826 which is opposite to the side at which the contacts discussed in connection with FIG. 8*g* are located. Photolithographic techniques which are similar to those discussed previously can be used to create these additional shield plate contacts. In particular, these additional shield plate contacts are coupled to shield plates which extend through the second set of storage elements 826 but not the first set of storage elements due to isolation structures 887 and 888. These isolation structures can be formed from a dielectric material using techniques which should be apparent to those skilled in the art to short circuit the shield plates so that the shield plates which extend in the first set of storage elements 820, and are coupled to contacts on the right hand side of the figure, do not communicate with the second set of storage elements 826, and the shield plates which extend in the second set of storage elements 826, and are coupled to contacts on the left hand side of the figure, do not communicate with the first set of storage elements 820.

Specifically, at the left hand side of the figure, shield plate contact 872 is coupled to SP1, shield plate contact 874 is coupled to SP2, shield plate contact 876 is coupled to SP3, shield plate contact 878 is coupled to SP4, shield plate contact 880 is coupled to SP5, shield plate contact 882 is coupled to SP6, shield plate contact 884 is coupled to SP7, and shield plate contact 886 is coupled to SP8. Note that the shield plate contact 850 (see FIG. 8*g*) can be used for both sets of storage elements, in one approach. It is also possible to provide separate shield plates contacts which are coupled to separate shield plates between SGS 824 and WL0 in the first set of storage elements 820, and between SGS 828 and WL0 in the second set of storage elements 826. In this case, appropriate insulating structures are used to insulate the shield plates from one another.

In this configuration, voltages can be coupled independently to a given word line which is shared among two sets of storage elements, and to a given shield plate which is associated with a given set of storage elements. As before, appropriate control circuit can be used to couple desired voltages to the contacts.

Figure 8I:
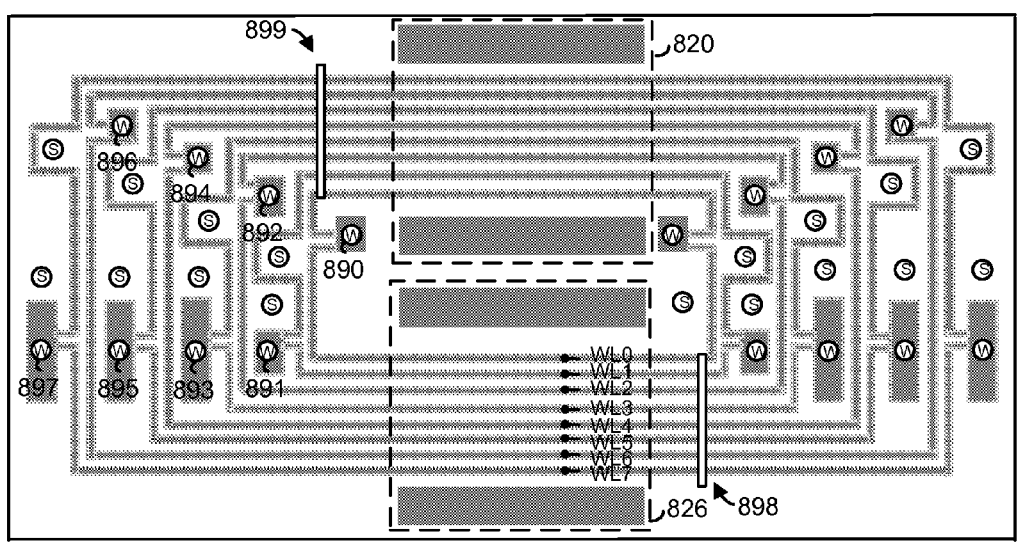
FIG. 8i depicts a top view of an alternative layered semiconductor device, showing separate word line contacts and shield plate contacts for each set of storage elements.

FIG. 8*i* depicts a top view of an alternative layered semiconductor device, showing separate word line contacts and shield plate contacts for each set of storage elements. In comparison to the configuration of FIG. 8*h*, additional word line contacts 890-897 are added at the left side of the sets of storage elements 820 and 826. Photolithographic techniques which are similar to those discussed previously can be used to create these additional word line contacts. In particular, these additional word line contacts are coupled to word lines which extend through the second set of storage elements 826 but not the first set of storage elements due to isolation structures 898 and 899. These isolation structures can be formed from a dielectric material using techniques which should be apparent to those skilled in the art to short circuit the word lines so that the word lines which extend in the first set of storage elements 820, and are coupled to contacts on the right hand side of the figure, do not communicate with the second set of storage elements 826, and the word lines which extend in the second set of storage elements 826, and are coupled to contacts on the left hand side of the figure, do not communicate with the first set of storage elements 820.

Specifically, at the left hand side of the figure, word line contact 890 is coupled to WL0, word line contact 891 is coupled to WL1, word line contact 892 is coupled to WL2, word line contact 893 is coupled to WL3, word line contact 894 is coupled to WL4, word line contact 895 is coupled to WL5, word line contact 896 is coupled to WL6, and word line contact 897 is coupled to WL7.

In this configuration, voltages can be coupled independently to a given word line which is associated with a given set of storage elements and to a given shield plate which is associated with a given set of storage elements. As before, appropriate control circuitry can be used to couple desired voltages to the contacts.

Figure 9:
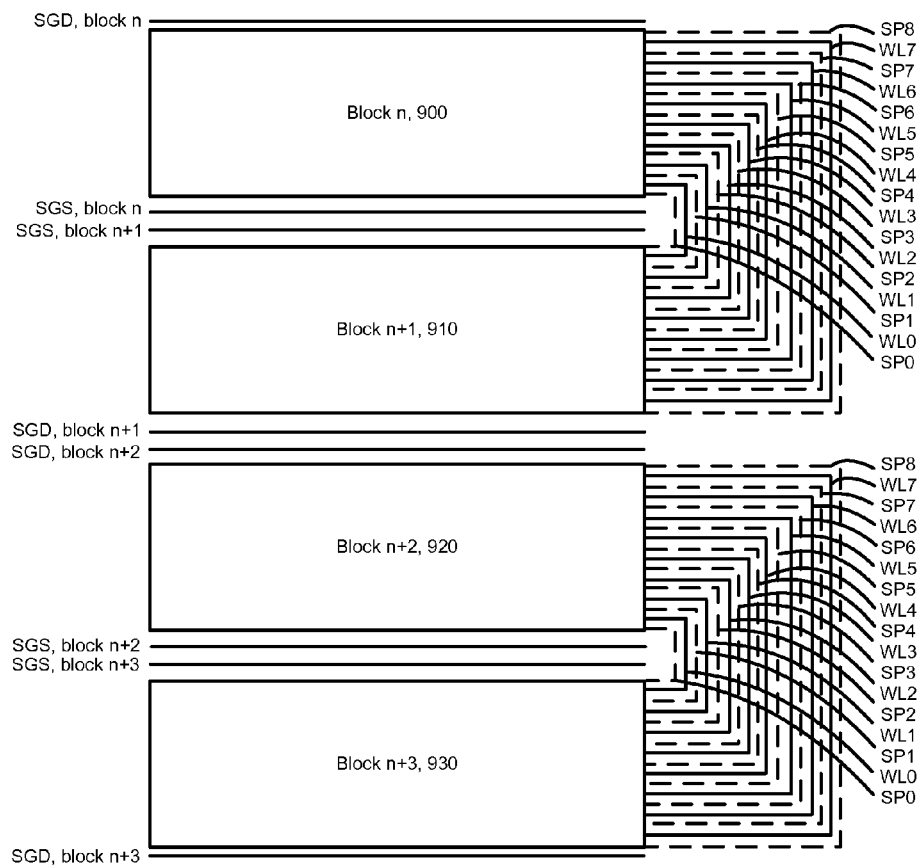
FIG. 9 depicts four blocks of storage elements, where word lines and shield plates are shared by a pair of blocks.

FIG. 9 depicts four blocks or other sets of storage elements in an array, where word lines and shield plates are shared by a pair of blocks. Here, four blocks 900, 910, 920 and 930 are depicted as an example, although additional pairs of blocks may be used. Further, the blocks may be provided on a common p-well. Blocks n and n+1 share word lines and shield plates, and blocks n+2 and n+3 share word lines and shield plates, in one possible configuration. As an illustration, eight word lines WL0 through WL7 and nine shield plates SP0 through SP8 are provided. The word lines are depicted by solid lines at the right hand side of the block while the shield plates are depicted by dashed lines. The drain select gate (SGD) and source select gate (SGS) are also depicted for each block. In one approach, each pair of blocks share row/word line decoding and shield plate decoding since the word lines and shield plates are shared, while each block has its own select gate source and drain decoding.

Figure 10:
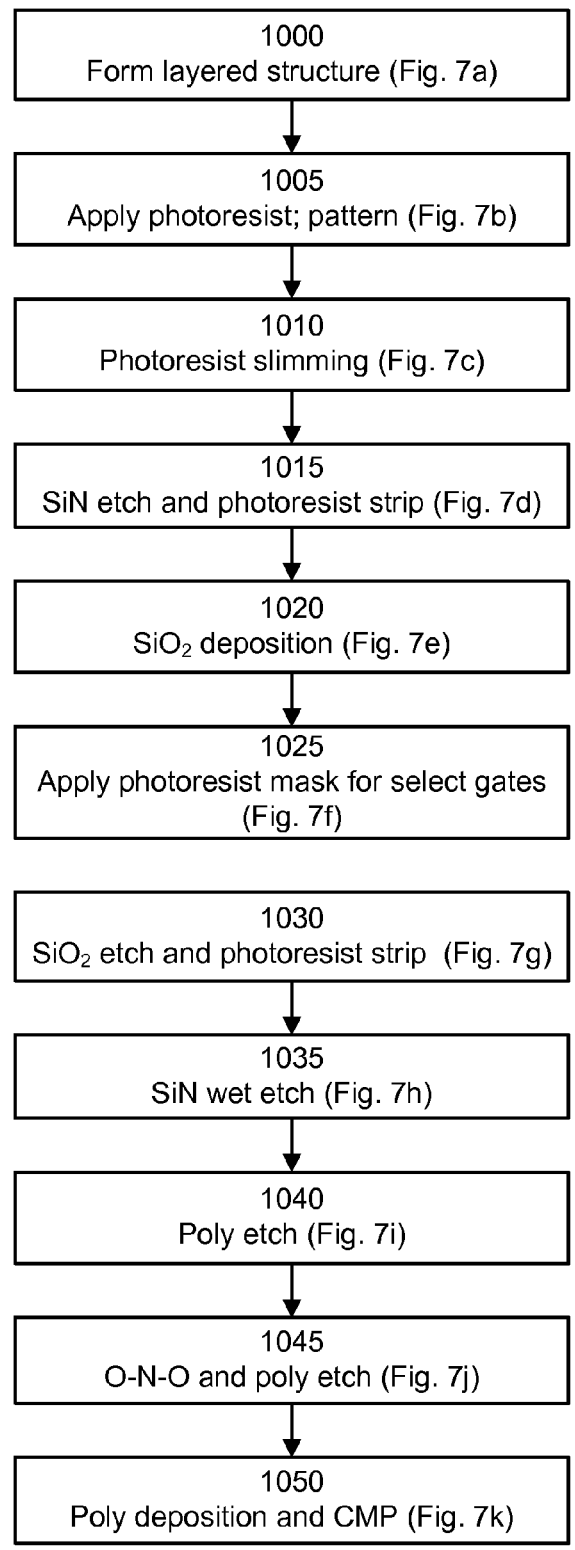
FIG. 10 depicts a process for fabricating non-volatile storage with shield plates.

FIG. 10 depicts a process for fabricating non-volatile storage with shield plates. Step 1000 includes forming a layered structure, e.g., as depicted in FIG. 7a. Step 1005 includes applying a photoresist and patterning the photoresist (see FIG. 7b). Step 1010 includes photoresist slimming (see FIG. 7c). Step 1015 includes SiN etching and photoresist stripping. Step 1020 includes $SiO_2$ deposition (see FIG. 7e). Step 1025 includes applying a photoresist mask for the select gates (see FIG. 7f). Step 1030 includes performing an $SiO_2$ etch and photoresist stripping. Step 1035 includes performing an SiN wet etch (see FIG. 7h). Step 1040 includes performing a poly etch for the upper poly layer used for the word lines (see FIG. 7i). Step 1045 includes etching the O—N—O layer and the lower poly layer used for the floating gates (see FIG. 7j). Step 1050 includes depositing and polishing a poly layer to provide the shield plates (see FIG. 7k).

Figure 11:
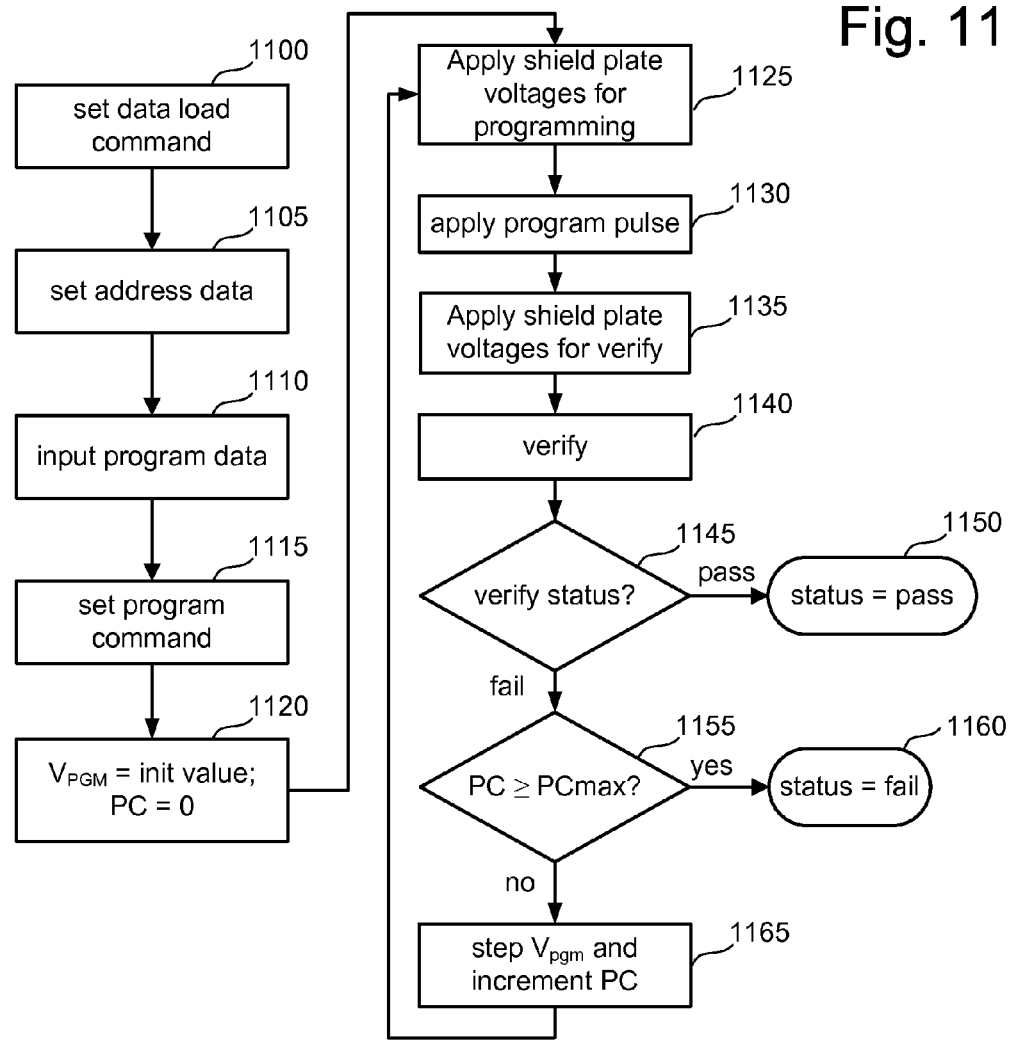
FIG. 11 is a flow chart describing one embodiment of a method for programming non-volatile memory.

FIG. 11 is a flow chart describing one embodiment of a method for programming non-volatile memory. In one implementation, storage elements are erased (in blocks or other units) prior to programming. In step 1100, a "data load" command is issued by control circuitry. In step 1105, address data designating the page address is input to a decoder from a controller or host. In step 1110, a page of program data for the addressed page is input to a data buffer for programming. That data is latched in the appropriate set of latches. In step 1115, a "program" command is issued.

Figure 12:
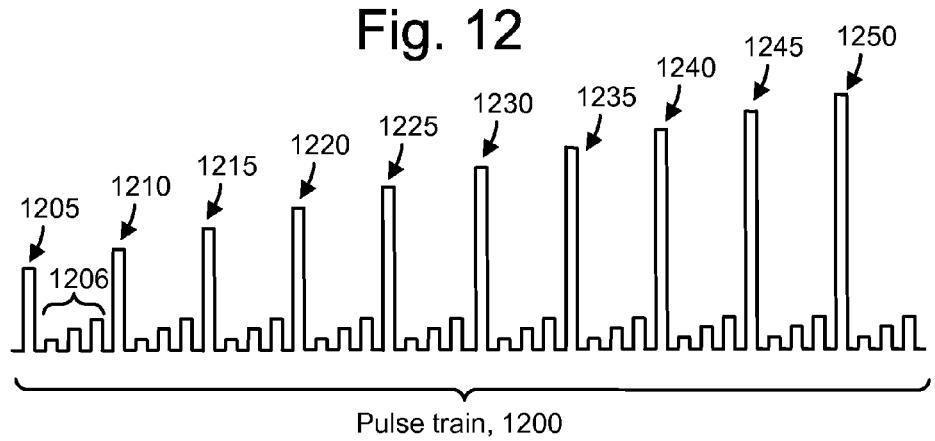
FIG. 12 depicts an example pulse train applied to the control gates of non-volatile storage elements during programming.

Triggered by the "program" command, the data latched in step 1110 will be programmed into the selected storage elements using the stepped program pulses 1205, 1210, 1215, 1220, 1225, 1230, 1235, 1240, 1245, 1250, . . . of the pulse train 1200 of FIG. 12 applied to the appropriate selected word line. In step 1120, the program voltage, $V_{PGM}$, is initialized to the starting pulse (e.g., 13 V or other value) and a program counter (PC) is initialized at zero. In step 1125, the shield plate voltages for programming are applied according to a desired programming control scheme (see examples further below). In step 1130, the first $V_{PGM}$ pulse is applied to the selected word line to begin programming storage elements associated with the selected word line. If logic "0" is stored in a particular data latch indicating that the corresponding storage element should be programmed, then the corresponding bit line is grounded. On the other hand, if logic "1" is stored in the particular latch indicating that the corresponding storage element should remain in its current data state, then the corresponding bit line is connected to Vdd, an internal regulated voltage of about 2 V, to inhibit programming.

In step 1135, the shield plate voltages are applied according to a desired sensing control scheme (see examples further below). In step 1140, the states of the selected storage elements are verified. If it is detected that the target threshold voltage of a selected storage element has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," all selected storage elements have been programmed. In step 1145 (verify status), a check is made as to whether all of the data latches are storing logic "1." If all of the data latches are storing logic "1," the programming process is complete and successful because all selected storage elements were programmed and verified. A status of "PASS" is reported in step 1150.

If, in step 1145, it is determined that not all of the data latches are storing logic "1," then the programming process continues. In step 1155, the program counter PC is checked against a program limit value PCmax. One example of a program limit value is twenty; however, other numbers can also be used. If the program counter PC is not less than PCmax, then the program process has failed and a status of "FAIL" is reported in step 1160. If the program counter PC is less than PCmax, then $V_{PGM}$ is increased by the step size and the program counter PC is incremented in step 1165 and the process loops back to step 1125.

FIG. 12 depicts an example pulse train 1200 applied to the control gates of non-volatile storage elements during programming. The pulse train 1200 includes a series of program pulses 1205, 1210, 1215, 1220, 1225, 1230, 1235, 1240, 1245, 1250, . . . , that are applied to a word line selected for programming. In one embodiment, the programming pulses have a voltage, $V_{PGM}$, which starts at 13 V and increases by increments, e.g., 0.5 V, for each successive programming pulse until a maximum of 21 V is reached. In between the program pulses are verify pulses. For example, verify pulse set 1206 includes three verify pulses. In some embodiments, there can be a verify pulse for each state that data is being programmed into, e.g., state A, B and C. In other embodiments, there can be more or fewer verify pulses.

Figure 13:
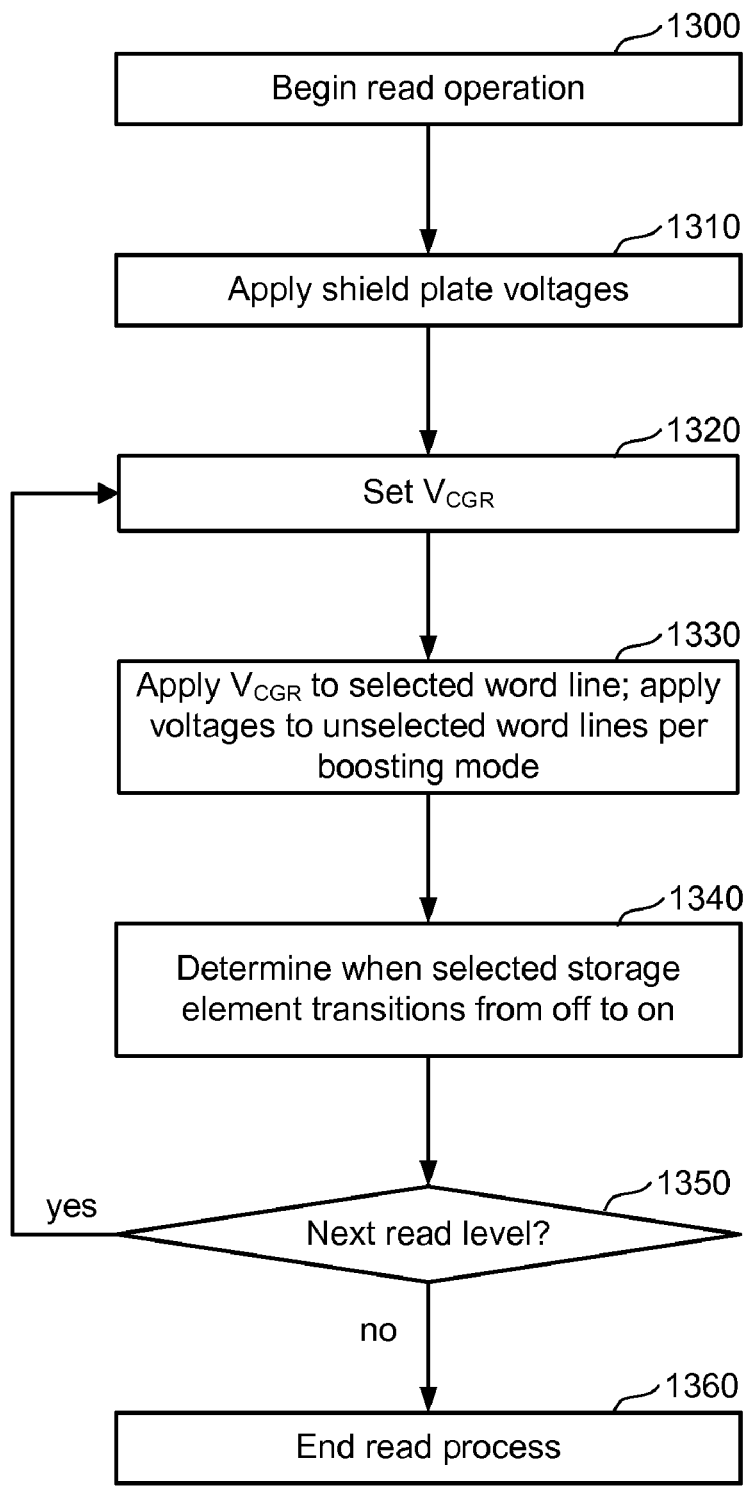
FIG. 13 is a flow chart describing one embodiment of a process for reading a non-volatile memory.

FIG. 13 is a flow chart describing one embodiment of a process for reading a non-volatile memory. The read process begins at step 1300. In step 1310, the shield plate voltages for sensing are applied according to the desired control scheme. At step 1320, $V_{CGR}$ is set based on the highest read level, for instance. Step 1330 includes applying $V_{CGR}$ to the selected word line and applying voltages to the unselected word lines according to the control scheme. At step 1340 a determination is made as to when the selected storage element transitions from off to on. If there is a next read level, at decision step 1350, the process continues at step 1320 with a different $V_{CGR}$. If there is no next read level, the read process ends at step 1360.

Example control schemes are provided below as illustrations. The control schemes apply to the case where word lines and shield plates are shared by two blocks of storage elements. However, the control schemes can be used as well for a single block or other set of storage elements. Other control schemes are also possible.

Table 1 depicts voltages which may be used during a sense operation, e.g., read or verify operation, for an embodiment which does not use source/drain implants. See also FIG. 6. In this table and the other tables, an operation is performed on block n+1, where blocks n and n+1 share word lines and shield plates. However, voltages for performing the operation on block n are analogous. Specifically, the voltages applied to SGD and SGS for block n+1 as depicted would be applied to block n, and the voltages applied to SGD and SGS for block n as depicted would be applied to block n+1. Similarly, voltages for performing the operation on block n+2 or n+3 are analogous. Moreover, the control schemes can be adapted for use with word lines and/or shield plates which are not shared among sets of storage elements by controlling a non-shared set of word lines and/or shield plates using the voltages provided.

Voltages which are applied to the drain select gate (SGD), word lines, source select gate (SGS), array source and p-well are depicted. In an example implementation, VREAD (the read pass voltage which is applied to unselected word lines) is about 4.5 V, VRSPH (read, shield plate, high voltage) is about 4 V, VRSPL (read, shield plate, low voltage) is about 2 V and VSS (steady state voltage) is about 0 V. Note that VRSPL can be about 30 to 90% of VRSPH in one possible approach. Further, VRSPH can be about 50 to 150% of VREAD. VCGR (control gate read voltage) is applied to the selected word line and varies for the different compare levels associated with different programming states or conditions. VGCR is set at the different levels at different times to determine when the selected storage elements transition between an on/off states. The value "i" denotes the number of word lines, and the word lines are numbered from WL0 at the source side of a NAND string to WLi−1 at the drain side of a NAND string. The shield plates are numbered from SP0 at the source side of WL0 to SPi at the drain side of WLi−1.

VREAD is applied to the unselected word lines while VCGR is applied to the selected word line. Further, VRSPL is applied to the shield plates which are adjacent to the selected word line. Specifically, VRSPL is applied to SPn, which is on the source side of WLn, and to SPn+1, which is on the drain side of WLn. The remaining shield plates receive VRSPH and VRSPL alternatingly, e.g., VRSPH on SPn+2, VRSPL on SPn+3, VRSPH on SPn+4, etc., and VRSPH on SPn−1, VRSPL on SPn−2, VRSPH on SPn−3, etc. Moreover, voltages are floated on the word lines and shield plates for the other pair of blocks, blocks n+2 and n+3, which are formed on the same p-well as blocks n and n+1.

TABLE 1

Sensing w/o source-drain implants

|  | Block n | Block n+1 | Block n+2 | Block n+3 |
|---|---|---|---|---|
| SGD |  | VSS | VSGD | VSS |
| WLn + 1 to WLi − 1 |  | VREAD |  | float |
| WLn (selected) |  | VCGR |  |  |
| WL0 to WLn − 1 |  | VREAD |  |  |
| SGS |  | VSS | VSGS | VSS |
| SPn + 3 to SPi |  | VRSPL or VRSPH alternating |  | float |
| SPn + 2 |  | VRSPH |  |  |
| SPn + 1 |  | VRSPL |  |  |
| SPn |  | VRSPL |  |  |
| SPn − 1 |  | VRSPH |  |  |
| SP0 to SPn − 2 |  | VRSPL or VRSPH alternating |  |  |
| Array source |  | VSS |  |  |
| P-well |  | VSS |  |  |

Table 2 depicts an alternative to the control scheme of Table 1, and may be used for sensing with or without source-drain implants. Here, a single shield plate voltage VRSP is used instead of high and low shield plate voltages, VRSPH and VRSPL, respectively. In an example implementation, VRSP is about 4-5 V. VRSP can be about 50 to 150% of VREAD, for instance. VSS (0 V) is applied to the shield plates which are adjacent to the selected word line. Specifically, VSS is applied to SPn, which is on the source side of WLn, and to SPn+1, which is on the drain side of WLn. The remaining unselected shield plates receive VSS and VRSP alternatingly, e.g., VRSP on SPn+2, VSS on SPn+3, VRSP on SPn+4, etc., and VRSP on SPn−1, VSS on SPn−2, VRSP on SPn−3, etc.

TABLE 2

Sensing w/or w/o source-drain implants

|  | Block n | Block n+1 | Block n+2 | Block n+3 |
|---|---|---|---|---|
| SGD |  | VSS | VSGD | VSS |
| WLn + 1 to WLi − 1 |  | VREAD |  | Float |
| WLn (selected) |  | VCGR |  |  |
| WL0 to WLn − 1 |  | VREAD |  |  |
| SGS |  | VSS | VSGS | VSS |
| SPn + 3 to SPi |  | VRSP or VSS alternating |  | Float |
| SPn + 2 |  | VRSP |  |  |
| SPn + 1 |  | VSS |  |  |
| SPn |  | VSS |  |  |
| SPn − 1 |  | VRSP |  |  |
| SP0 to SPn − 2 |  | VRSP or VSS alternating |  |  |
| Array source |  | VSS |  |  |
| P-well |  | VSS |  |  |

Table 3 depicts voltages which maybe used during a programming operation for embodiments with or without source/drain implants, in a self-boosting mode. In an example implementation, VPASS (the pass voltage which is applied to unselected word lines) is about 9 V, VPSPH (program, shield plate, high voltage) is also about 9 V, VPSPL (program, shield plate, low voltage) is about 6 V and VDD (internal regulated voltage) is about 2 V. VTH is the threshold voltage of the drain select gate and may be about 0.7-1.2 V. Note that VPSPL can be about 50 to 90% of VPSPH in one possible approach. Further, VPSPH can be about 50 to 100% of VPGM. VPGM (programming voltage) is applied to the selected word line and typically increases in a step wise manner from about 13 to 21 V. See FIG. 12.

VPASS is applied to the unselected word lines while VPGM is applied to the selected word line. Further, VPSPH is applied to the shield plates which are adjacent to the selected word line. Specifically, VRSPH is applied to SPn, which is on the source side of WLn, and to SPn+1, which is on the drain side of WLn. The remaining unselected shield plates receive VPSPH and VPSPL alternatingly, e.g., VPSPL on SPn+2, VPSPH on SPn+3, VPSPL on SPn+4, etc., and VPSPL on SPn−1, VPSPH on SPn−2, VPSPL on SPn−3, etc. Moreover, voltages are floated on the word lines and shield plates for blocks n+2 and n+3.

TABLE 3

Programming w/ or w/o source-drain implants, self-boosting mode

|  | Block n | Block n+1 | Block n+2 | Block n+3 |
|---|---|---|---|---|
| SGD |  | VSS | VDD + VTH | VSS |
| WLn + 1 to WLi − 1 |  | VPASS |  | float |
| WLn (selected) |  | VPGM |  |  |
| WL0 to WLn − 1 | VPASS |  |  |  |
| SGS |  | VSS | 0 V | VSS | VSS |
| SPn + 3 to SPi |  | VPSPL or VPSPH alternating |  | float |
| SPn + 2 |  | VPSPL |  |  |
| SPn + 1 |  | VPSPH |  |  |

TABLE 3-continued

Programming w/ or w/o source-drain implants, self-boosting mode

| | Block n | Block n+1 | Block n+2 | Block n+3 |
|---|---|---|---|---|
| SPn | | VPSPH | | |
| SPn−1 | | VPSPL | | |
| SP0 to SPn−2 | | VPSPL or VPSPH alternating | | |
| Array source | | VDD | | |
| P-well | | VSS | | |

Table 4 depicts voltages which maybe used during a programming operation for embodiments without source/drain implants, in an erased area self boosting (EASB) mode. In an example implementation, VPASS is about 9 V, VPSPH is about 10 V, VPSPL is about 6 V and VDD is about 2 V. VPASS is applied to the unselected word lines except for WLn−1, which receives VDD, and WLn−2, which receives 0 V. VPGM is applied to the selected word line. Further, VPSPH is applied to the shield plates which are adjacent to the selected word line. Specifically, VRSPH is applied to SPn, which is on the source side of WLn, and to SPn+1, which is on the drain side of WLn. The remaining unselected shield plates receive VPSPH and VPSPL alternatingly, except for SPn−1 and SPn−2, which receive VDD. For example, the control provides VPSPL on SPn+2, VPSPH on SPn+3, VPSPL on SPn+4, etc., and VPSPH on SPn−3, VPSPL on SPn−4, VPSPH on SPn−5, etc. Moreover, voltages are floated on the word lines and shield plates for blocks n+2 and n+3.

For programming a memory device which includes source-drain implants, in the EASB mode, the control scheme of Table 4 may be used except VSS replaces VDD on the designated shield plates and word line.

TABLE 4

Programming w/o source-drain implants, erased area self-boosting mode

| | Block n | Block n+1 | Block n+2 | Block n+3 |
|---|---|---|---|---|
| SGD | VSS | VDD + VTH | VSS | |
| WLn+1 to WLi−1 | | VPASS | Float | |
| WLn (selected) | | VPGM | | |
| WLn−1 | | VDD | | |
| WLn−2 | | 0 V | | |
| WL0 to WLn−3 | | VPASS | | |
| SGS | VSS | 0 V | VSS | |
| SPn+3 to SPi | | VPSPL or VPSPH alternating | Float | |
| SPn+2 | | VPSPL | | |
| SPn+1 | | VPSPH | | |
| SPn | | VPSPH | | |
| SPn−1 | | VDD | | |
| SPn−2 | | VDD | | |
| SPn−3 | | VPSPH | | |
| SP0 to SPn−4 | | VPSPL or VPSPH alternating | | |
| Array source | | VDD | | |
| P-well | | VSS | | |

Table 5 depicts voltages which maybe used during a programming operation for embodiments without source/drain implants, in a local self boosting (LSB) mode. In an example implementation, VPASS is about 9 V, VPSPH is about 10 V, VPSPL is about 6 V and VDD is about 2 V. VPASS is applied to the unselected word lines except for WLn−1 and WLn+1, which receive VDD, and WLn−2 and WLn+2, which receive 0 V. VPGM is applied to the selected word line. Further, VPSPH is applied to the shield plates which are adjacent to the selected word line. Specifically, VRSPH is applied to SPn, which is on the source side of WLn, and to SPn+1, which is on the drain side of WLn. The remaining unselected shield plates receive VPSPH and VPSPL alternatingly, except for SPn−1, SPn−2, SPn+2 and SPn+3, which receive VDD. For example, the control provides VPSPH on SPn+4, VPSPL on SPn+5, VPSPH on SPn+6, etc., and VPSPH on SPn−3, VPSPL on SPn−4, VPSPH on SPn−5, etc. Moreover, voltages are floated on the word lines and shield plates for blocks n+2 and n+3.

For programming a memory device which includes source-drain implants, in the LSB mode, the control scheme of Table 5 may be used except VSS replaces VDD on the designated shield plates and word lines.

TABLE 5

Programming w/o source-drain implants, local self-boosting mode

| | Block n | Block n+1 | Block n+2 | Block n+3 |
|---|---|---|---|---|
| SGD | VSS | VDD + VTH | VSS | |
| WLn+3 to WLi−1 | | VPASS | Float | |
| WLn+2 | | 0 V | | |
| WLn+1 | | VDD | | |
| WLn (selected) | | VPGM | | |
| WLn−1 | | VDD | | |
| WLn−2 | | 0 V | | |
| WL0 to WLn−3 | | VPASS | | |
| SGS | VSS | 0 V | VSS | |
| SPn+3 to SPi | | VPSPL or VPSPH alternating | Float | |
| SPn+4 | | VPSPH | | |
| SPn+3 | | VDD | | |
| SPn+2 | | VDD | | |
| SPn+1 | | VPSPH | | |
| SPn | | VPSPH | | |
| SPn−1 | | VDD | | |
| SPn−2 | | VDD | | |
| SPn−3 | | VPSPH | | |
| SP0 to SPn−4 | | VPSPL or VPSPH alternating | | |
| Array source | | VDD | | |
| P-well | | VSS | | |

Table 6 depicts voltages which maybe used during an erase operation for embodiments with or without source/drain implants. In an example implementation, VERASE (erase voltage) is about 20 V. This relatively high voltage is applied to the p-well while VSS is applied to the word lines and shield plates of the blocks being erased, e.g., blocks n and n+1, removing charge which is stored in the floating gates of the storage elements. Voltages are floated on the word lines and shield plates for blocks n+2 and n+3.

TABLE 6

Erasing w/ or w/o source-drain implants

| | Block n | Block n+1 | Block n+2 | Block n+3 |
|---|---|---|---|---|
| SGD | | Float | | |
| WL0 to WLi−1 | | VSS | | Float |
| SGS | | Float | | |
| SP0 to SPi | | | | |
| Array source | | | | |
| P-well | | VERASE | | |

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for fabricating non-volatile storage, comprising:
   forming a plurality of non-volatile storage elements on a substrate, the plurality of non-volatile storage elements are arranged in first and second sets;
   forming a plurality of word lines in communication with the plurality of non-volatile storage elements of the first and second sets;
   forming a first plurality of shield plates, each shield plate of the first plurality of shield plates extends between different adjacent non-volatile storage elements which are associated with adjacent word lines of the first set; and
   forming a second plurality of shield plates, each shield plate of the second plurality of shield plates extends between different adjacent non-volatile storage elements which are associated with adjacent word lines of the second set, pairs of shield plates are coupled by an associated conductive path, each pair of shield plates comprises a shield plate in the first set and an associated shield plate in the second set.

2. The method of claim 1, further comprising:
   providing at least one control circuit for coupling a voltage independently to each pair of shield plates.

3. The method of claim 1, wherein:
   each pair of shield plates is electrically conductive and independently controllable.

4. The method of claim 1, wherein:
   each shield plate comprises a conductive material which extends at least in part between floating gates of the different adjacent non-volatile storage elements between which the shield plate extends.

5. The method of claim 1, wherein:
   the plurality of non-volatile storage elements are arranged in NAND strings, the plurality of shield plates extend transversely to the NAND strings.

6. The method of claim 1, wherein:
   each pair of shield plates is provided in a separate conductive loop.

7. The method of claim 1, wherein:
   pairs of the word lines are provided in a conductive loop, each pair of word lines comprises a word line for the first set and an associated word line for the second set.

8. The method of claim 1, further comprising:
   forming a first plurality of electrical contacts carried by the substrate laterally of a region of the substrate on which the plurality of non-volatile storage elements are formed, each electrical contact of the first plurality of electrical contacts is associated with a corresponding pair of shield plates for coupling a voltage thereto.

9. The method of claim 8, further comprising:
   forming a second plurality of electrical contacts carried by the substrate laterally of the region, each electrical contact of the second plurality of electrical contacts is associated with a corresponding pair of word lines for coupling a voltage thereto, each pair of word lines comprises a word line for the first set and an associated word line for the second set.

10. The method of claim 9, wherein:
    the first and second plurality of electrical contacts are carried by the substrate on a common side of the region.

11. The method of claim 1, wherein:
    the first and second sets comprise first and second blocks of non-volatile storage elements, respectively, and each block is erasable as a unit.

12. A method for fabricating non-volatile storage, comprising:
    forming a plurality of non-volatile storage elements on a substrate, the plurality of non-volatile storage elements are arranged in first and second sets;
    forming a plurality of word lines in communication with the plurality of non-volatile storage elements of the first and second sets;
    forming a first plurality of shield plates, each shield plate of the first plurality of shield plates extends between different adjacent non-volatile storage elements which are associated with adjacent word lines of the first set, is electrically conductive and is independently controllable; and
    forming a second plurality of shield plates, each shield plate of the second plurality of shield plates extends between different adjacent non-volatile storage elements which are associated with adjacent word lines of the second set, is electrically conductive and is independently controllable.

13. The method of claim 12, further comprising:
    providing at least one control circuit for coupling a voltage independently to each shield plate.

14. The method of claim 12, wherein:
    each shield plate comprises a conductive material which extends at least in part between floating gates of the different adjacent non-volatile storage elements between which the shield plate extends.

15. The method of claim 12, wherein:
    the plurality of non-volatile storage elements are arranged in NAND strings, the plurality of shield plates extend transversely to the NAND strings.

16. The method of claim 12, wherein:
    pairs of shield plates are coupled by an associated conductive path, each pair of shield plates comprises a shield plate in the first set and an associated shield plate in the second set.

17. The method of claim 12, wherein:
    pairs of the word lines are provided in a conductive loop, each pair of word lines comprises a word line in the first set and an associated word line in the second set.

18. The method of claim 12, further comprising:
    forming a first plurality of electrical contacts carried by the substrate laterally of a region of the substrate on which the plurality of non-volatile storage elements are formed, each electrical contact of the first plurality of electrical contacts is associated with a corresponding shield plate of the first plurality of shield plates for coupling a voltage thereto; and
    forming a second plurality of electrical contacts carried by the substrate laterally of the region, each electrical contact of the second plurality of electrical contacts is associated with a corresponding shield plate of the second plurality of shield plates for coupling a voltage thereto, the first plurality of electrical contacts are on an opposite side of the region than the second plurality of electrical contacts.

19. The method of claim 18, further comprising:
    forming a third plurality of electrical contacts carried by the substrate laterally of the region, each electrical contact of the third plurality of electrical contacts is associated with a corresponding word line of the first set for coupling a voltage thereto, and the first and third plurality of electrical contacts are carried by the substrate on a first common side of the region.

20. The method of claim 19, further comprising:
    forming a fourth plurality of electrical contacts carried by the substrate laterally of the region, each electrical contact of the fourth plurality of electrical contacts is associated with a corresponding word line of the second set for coupling a voltage thereto, the second and fourth plurality of electrical contacts are carried by the substrate on a second common side of the region, the first and second common sides are at opposite sides of the region.

21. The method of claim 12, wherein:
the first and second sets comprise first and second blocks of non-volatile storage elements, respectively, and each block is erasable as a unit.

* * * * *